US011158590B1

(12) United States Patent
Lan et al.

(10) Patent No.: US 11,158,590 B1
(45) Date of Patent: Oct. 26, 2021

(54) CAPACITOR INTERPOSER LAYER (CIL) IN A DIE-TO-WAFER THREE-DIMENSIONAL (3D) INTEGRATED CIRCUIT (IC) (3DIC)

(71) Applicant: QUALCOMM Incorporated, San Diego, CA (US)

(72) Inventors: Je-Hsiung Lan, San Diego, CA (US); Jonghae Kim, San Diego, CA (US); Jinseong Kim, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/856,132

(22) Filed: Apr. 23, 2020

(51) Int. Cl.
| | | |
|---|---|---|
| *H01L 23/00* | (2006.01) |
| *H01L 49/02* | (2006.01) |
| *H01L 23/48* | (2006.01) |
| *H01L 21/768* | (2006.01) |
| *H01L 27/01* | (2006.01) |
| *H01L 25/18* | (2006.01) |
| *H01L 25/00* | (2006.01) |
| *H01L 21/288* | (2006.01) |
| *H01L 21/311* | (2006.01) |
| *H01L 21/56* | (2006.01) |

(52) U.S. Cl.
CPC ............ *H01L 24/08* (2013.01); *H01L 21/288* (2013.01); *H01L 21/31111* (2013.01); *H01L 21/565* (2013.01); *H01L 21/76802* (2013.01); *H01L 21/76877* (2013.01); *H01L 23/481* (2013.01); *H01L 24/05* (2013.01); *H01L 24/13* (2013.01); *H01L 24/89* (2013.01); *H01L 25/18* (2013.01); *H01L 25/50* (2013.01); *H01L 27/01* (2013.01); *H01L 28/90* (2013.01); *H01L 2224/0557* (2013.01); *H01L 2224/05647* (2013.01); *H01L 2224/08147* (2013.01); *H01L 2224/13025* (2013.01); *H01L 2224/13147* (2013.01); *H01L 2224/80895* (2013.01); *H01L 2924/19011* (2013.01); *H01L 2924/19041* (2013.01)

(58) Field of Classification Search
CPC combination set(s) only.
See application file for complete search history.

(56) References Cited

U.S. PATENT DOCUMENTS

| | | | | |
|---|---|---|---|---|
| 10,057,976 B1* | 8/2018 | Shi | ...................... | H01L 21/4853 |
| 2014/0252544 A1* | 9/2014 | Li | ........................... | H01L 23/50 |
| | | | | 257/532 |

(Continued)

OTHER PUBLICATIONS

U.S. Appl. No. 62/956,535, filed Jan. 2, 2020.
U.S. Appl. No. 16/798,161, filed Feb. 21, 2020.

*Primary Examiner* — Mamadou L Diallo
(74) *Attorney, Agent, or Firm* — Qualcomm Incorporated

(57) ABSTRACT

A capacitor interposer layer (CIL) in a die-to-wafer three dimensional integrated circuit (3DIC) and methods of forming the same are disclosed. A CIL is formed in a wafer under a power distribution network (PDN) die area of a chip. Electrical connections between the wafer and the chip are formed using a copper-to-copper bond. This placement allows the capacitor to be close to the PDN die area within the chip to reduce equivalent series resistance (ESR) and equivalent series inductance (ESL), while permitting a relatively low profile device with reduced PDN voltage droop.

20 Claims, 22 Drawing Sheets

(56) References Cited

U.S. PATENT DOCUMENTS

| | | | |
|---|---|---|---|
| 2015/0028450 A1* | 1/2015 | Park | H01L 21/76898 |
| | | | 257/532 |
| 2015/0221714 A1* | 8/2015 | Gu | H01L 23/5383 |
| | | | 257/532 |
| 2016/0093588 A1* | 3/2016 | Wang | B23H 7/10 |
| | | | 257/737 |
| 2016/0276324 A1* | 9/2016 | Lin | H01L 23/49827 |
| 2019/0139889 A1* | 5/2019 | Ding | H01L 23/5223 |
| 2019/0206815 A1* | 7/2019 | Laguvaram | H01L 23/642 |
| 2019/0326212 A1* | 10/2019 | Huang | H05K 1/0237 |
| 2020/0204067 A1* | 6/2020 | Dabral | H01L 23/5223 |

\* cited by examiner

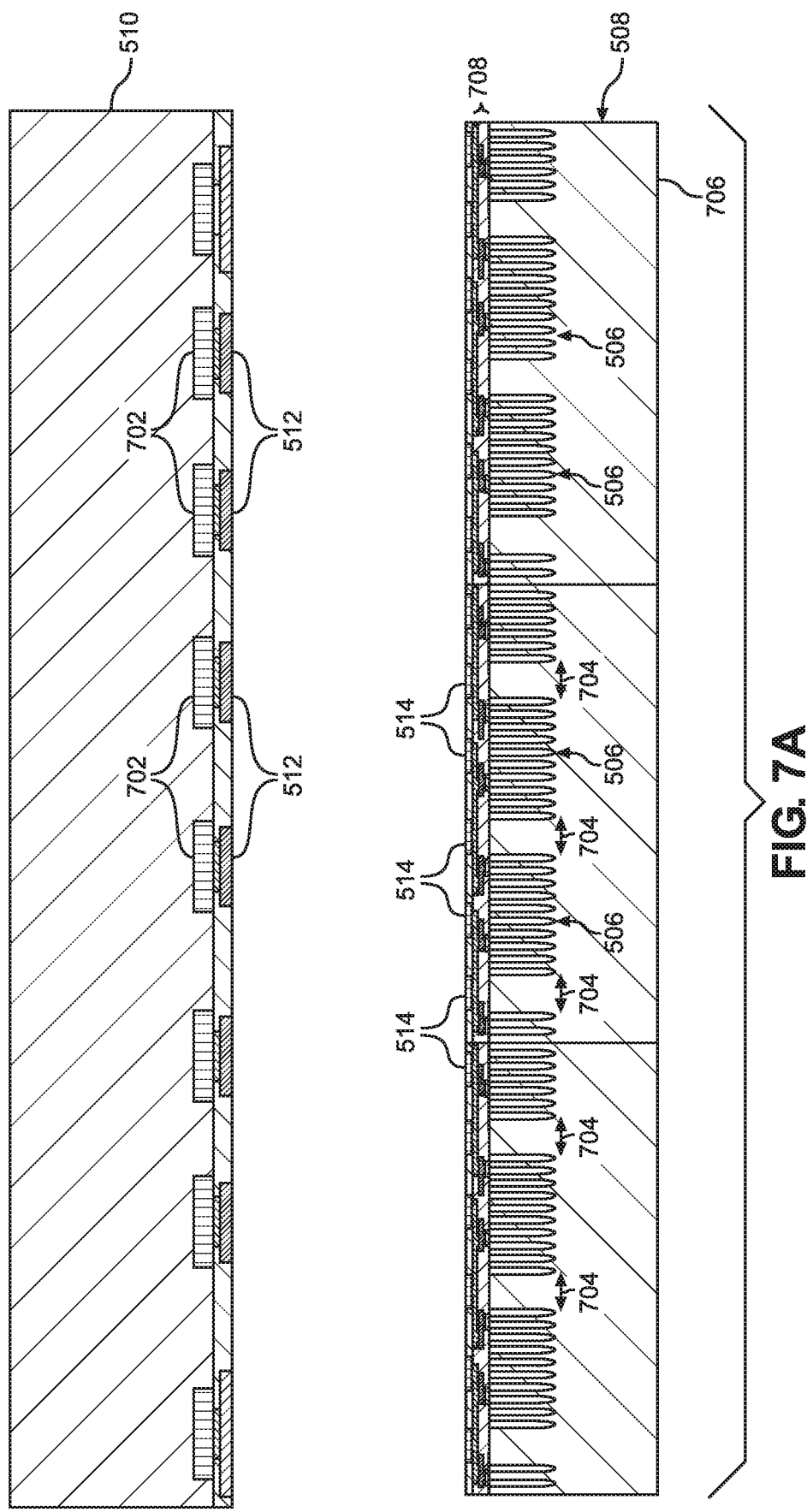

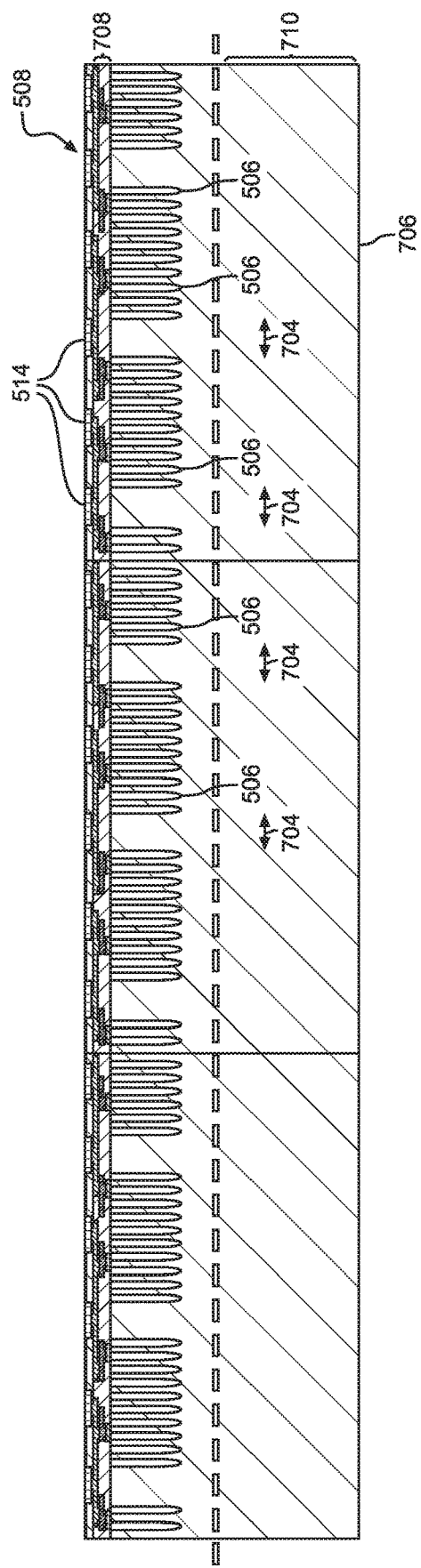
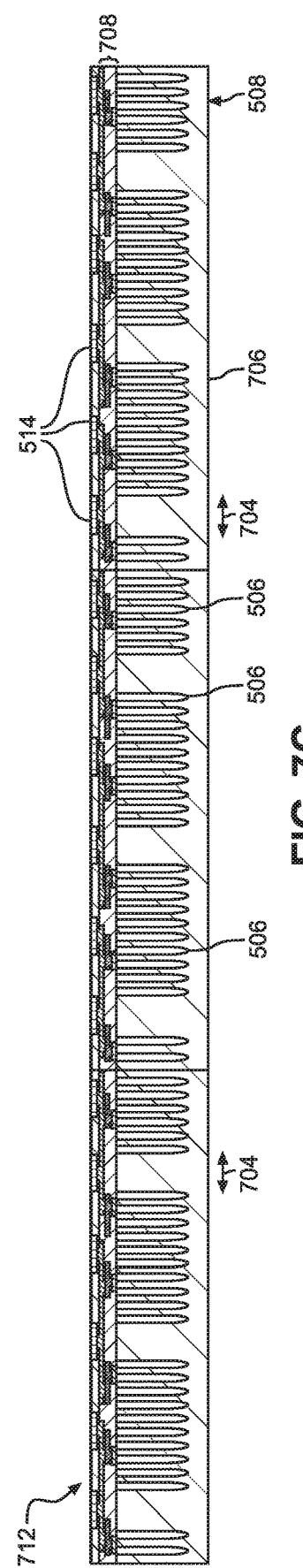
FIG. 7B
FIG. 7C

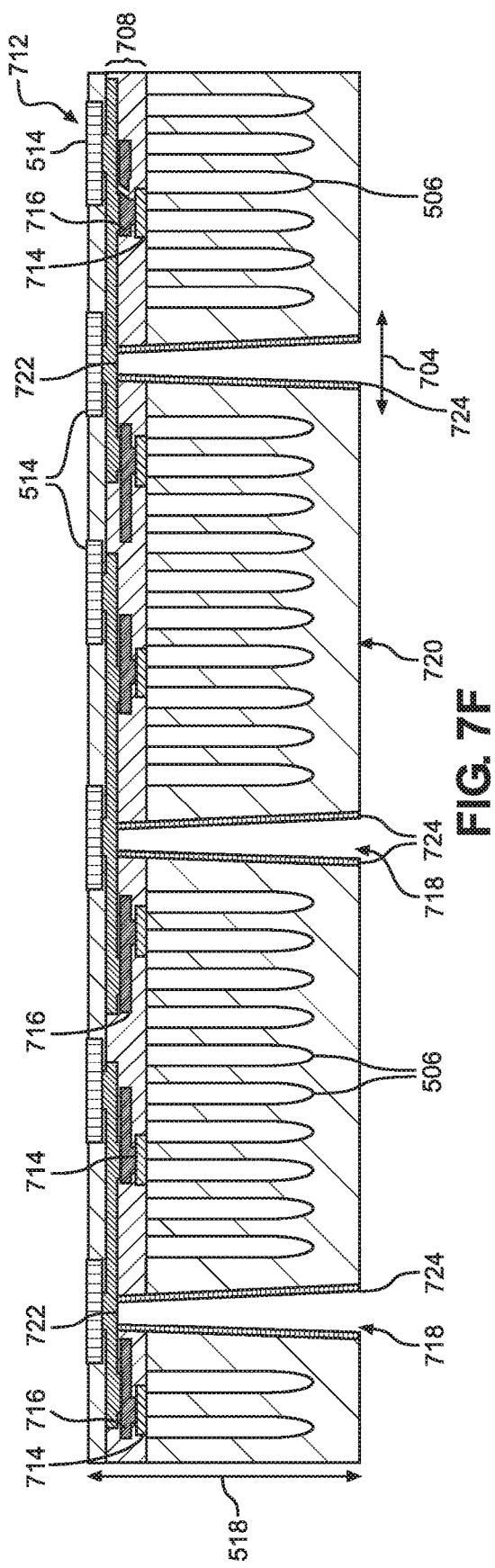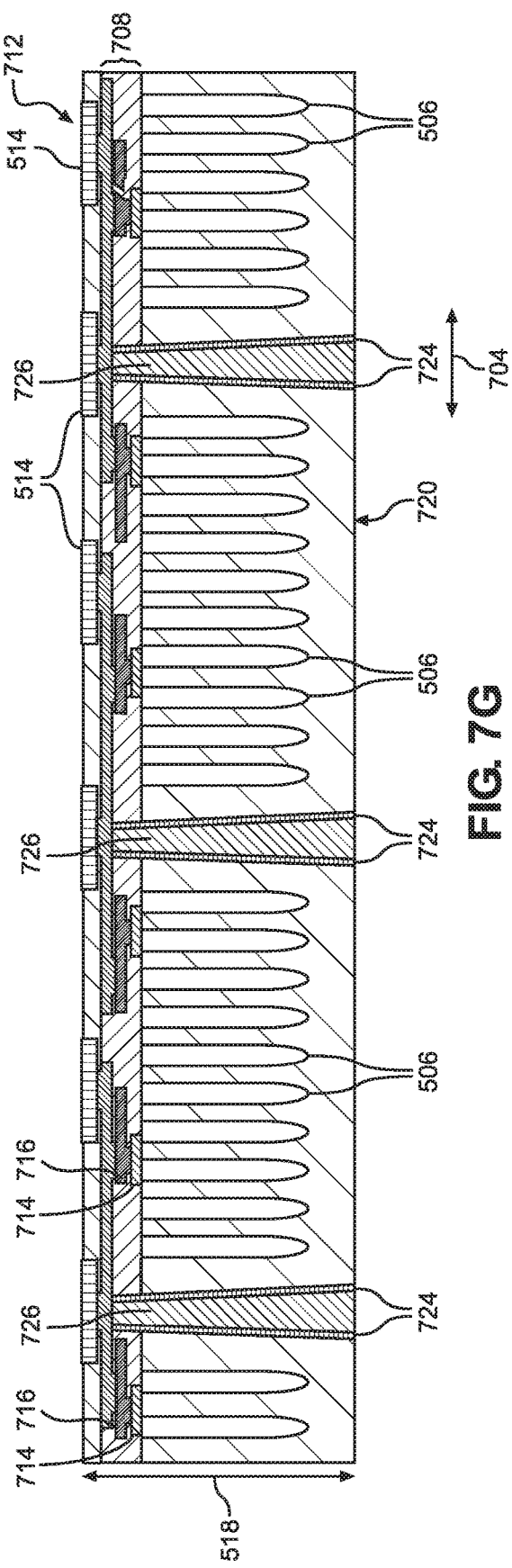

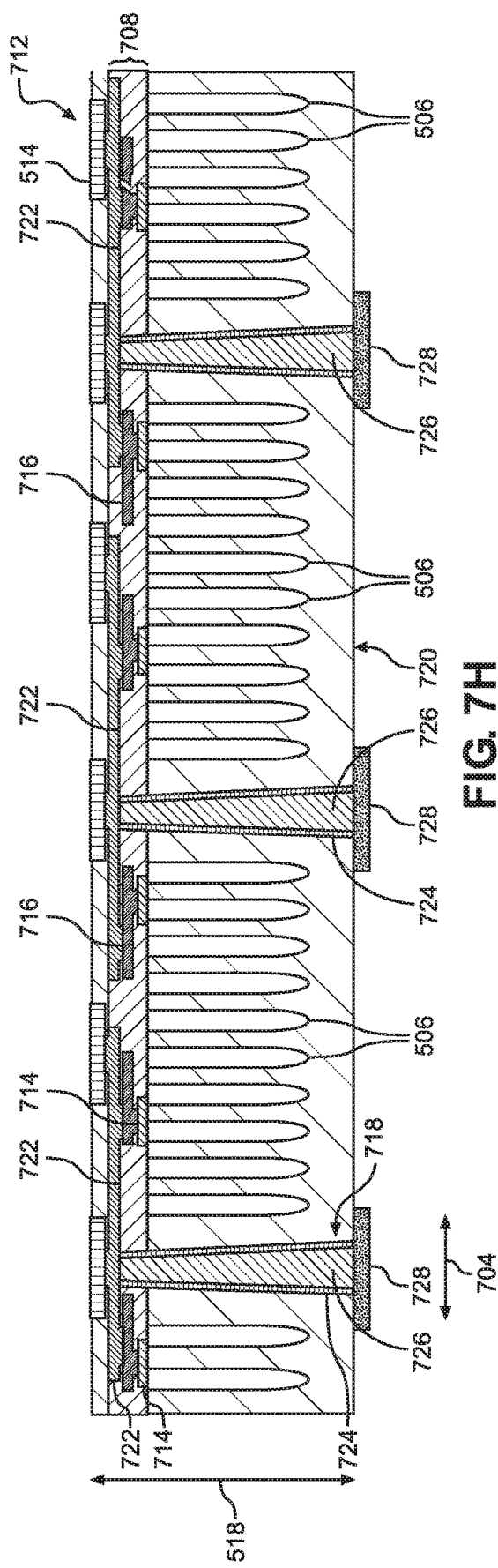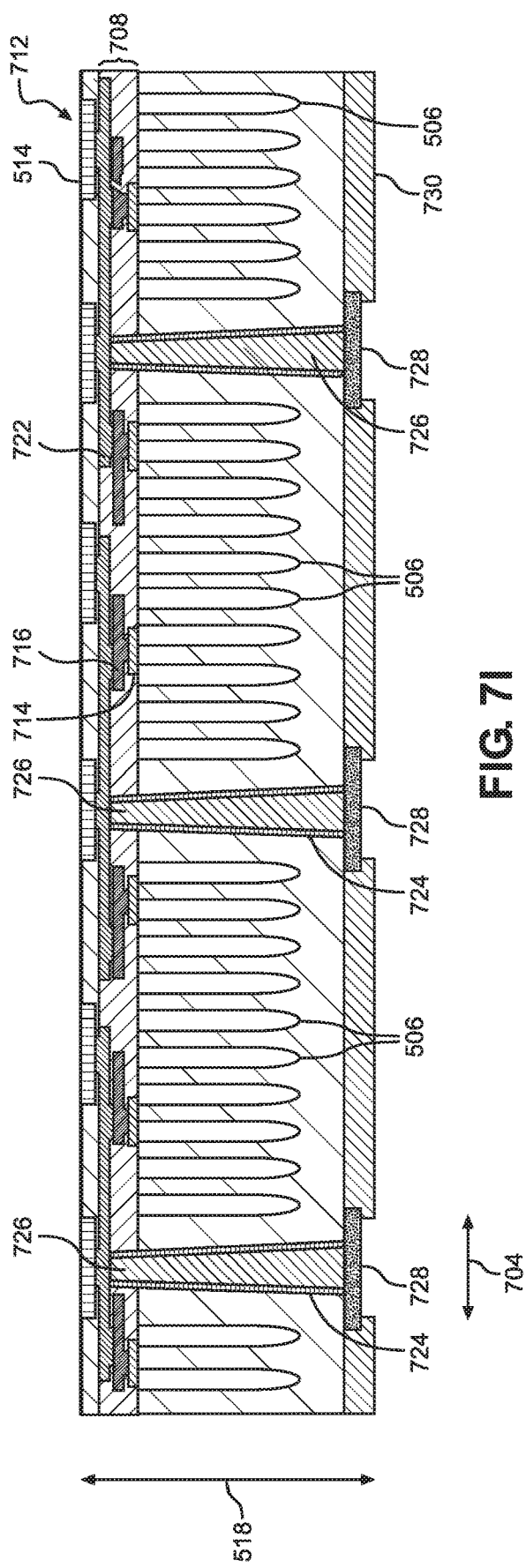

US 11,158,590 B1

CAPACITOR INTERPOSER LAYER (CIL) IN A DIE-TO-WAFER THREE-DIMENSIONAL (3D) INTEGRATED CIRCUIT (IC) (3DIC)

BACKGROUND

I. Field of the Disclosure

The technology of the disclosure relates generally to integrated circuits (IC) and, more particularly, to providing a capacitor in an interposer layer between a die and a wafer of an IC.

II. Background

Computing devices typically rely on integrated circuits (ICs) to handle various functions. As the size of many computing devices shrink, there has been pressure to change the geometries of the ICs. One such change in the geometry is a three-dimensional (3D) IC (3DIC), where a chip may be stacked on top of a wafer. Such arrangement may be desirable to conserve space. However, such high-performance IC may be vulnerable to excessive voltage drop in a power distribution network extending between the battery of the computing device and the IC where voltage drop may be caused, at least in part, by equivalent series resistance (ESR) and/or equivalent series inductance (ESL) of the conductors between the battery and the internal power origin within the IC.

One technique used in some situations is to add a bypass capacitor. Current proposals place such bypass capacitors underneath a substrate, which is relatively remote from the internal power distribution network. Accordingly, there is room for improved bypass capacitors.

SUMMARY OF THE DISCLOSURE

Aspects disclosed in the detailed description include a capacitor interposer layer (CIL) in a die-to-wafer three-dimensional (3D) integrated circuit (IC) (3DIC) and methods of forming the same. In an exemplary aspect, a CIL is formed in a wafer under a power distribution network (PDN) die area of a chip. Electrical connections between the wafer and the chip are formed using a copper-to-copper bond. This placement allows a capacitor to be close to the PDN die area within the chip to reduce equivalent series resistance (ESR) and equivalent series inductance (ESL), while permitting a relatively low profile device with reduced PDN voltage droop.

In this regard in one aspect, an IC is disclosed. The IC includes a chip comprising a first copper pad. The IC also includes a CIL. The CIL includes a trench capacitor comprising a plurality of trenches, at least two trenches defining a gap therebetween. The CIL also includes a second copper pad coupled to the first copper pad, the second copper pad positioned between the at least two trenches. The CIL also includes a metal pad conductively coupled to the second copper pad. The CIL also includes a via extending from a lower surface of the gap to the metal pad.

In another aspect, a method of forming an IC is disclosed. The method includes forming gaps between trench capacitors in a CIL. The method also includes etching the CIL at the gaps to form a via cavity. The method also includes forming a via in the via cavity. The method also includes attaching the CIL to a chip using a copper-to-copper bond between two copper pads.

DETAILED DESCRIPTION

Figure 1:
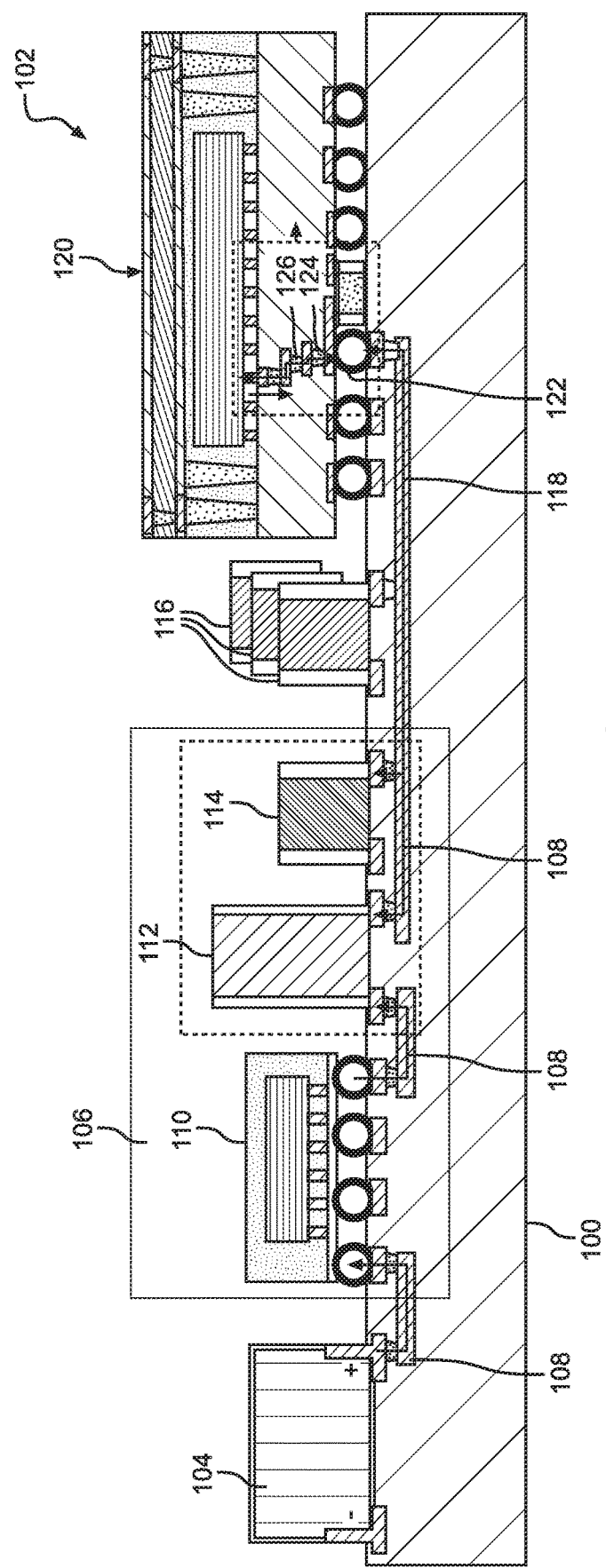
FIG. 1 is a diagram of an exemplary printed circuit board (PCB) for a computing device showing a macro power delivery system from a battery to an integrated circuit (IC) with appurtenant voltage drops from intervening elements.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a capacitor interposer layer (CIL) in a die-to-wafer three-dimensional (3D) integrated circuit (IC) (3DIC) and methods of forming the same. In an exemplary aspect, a CIL is formed in a wafer under a power distribution network (PDN) die area of a chip. Electrical connections between the wafer and the chip are formed using a copper-to-copper bond. This placement allows a capacitor to be close to the PDN die area within the chip to reduce equivalent series resistance (ESR) and equivalent series inductance (ESL), while permitting a relatively low profile device with reduced PDN voltage droop.

In this regard, FIG. 1 is a diagram of components on a printed circuit board (PCB) 100 of a computing device 102. In particular, a battery 104 may be positioned on the PCB 100 and coupled to a power management IC (PMIC) 106 via internal metal lines 108. The PMIC 106 may include a switched mode power supply circuit 110 and one or more inductors 112 (one shown) and one or more capacitors 114 (one shown). Additional capacitors 116 may be positioned on the PCB 100 and may be coupled to PCB power planes 118 within the PCB 100. An IC 120 is coupled to the power planes 118 through a solder bump 122. Internal metal layers 124 and vias 126 may convey power from the solder bump 122 to an internal PDN die area of the IC 120. Collectively, the metal lines 108, the PMIC 106, and any additional capacitors 116 may form a macro power delivery network in that they are outside the IC 120 and on the PCB 100 such that they may also supply power to other ICs on the PCB 100.

Figure 2:
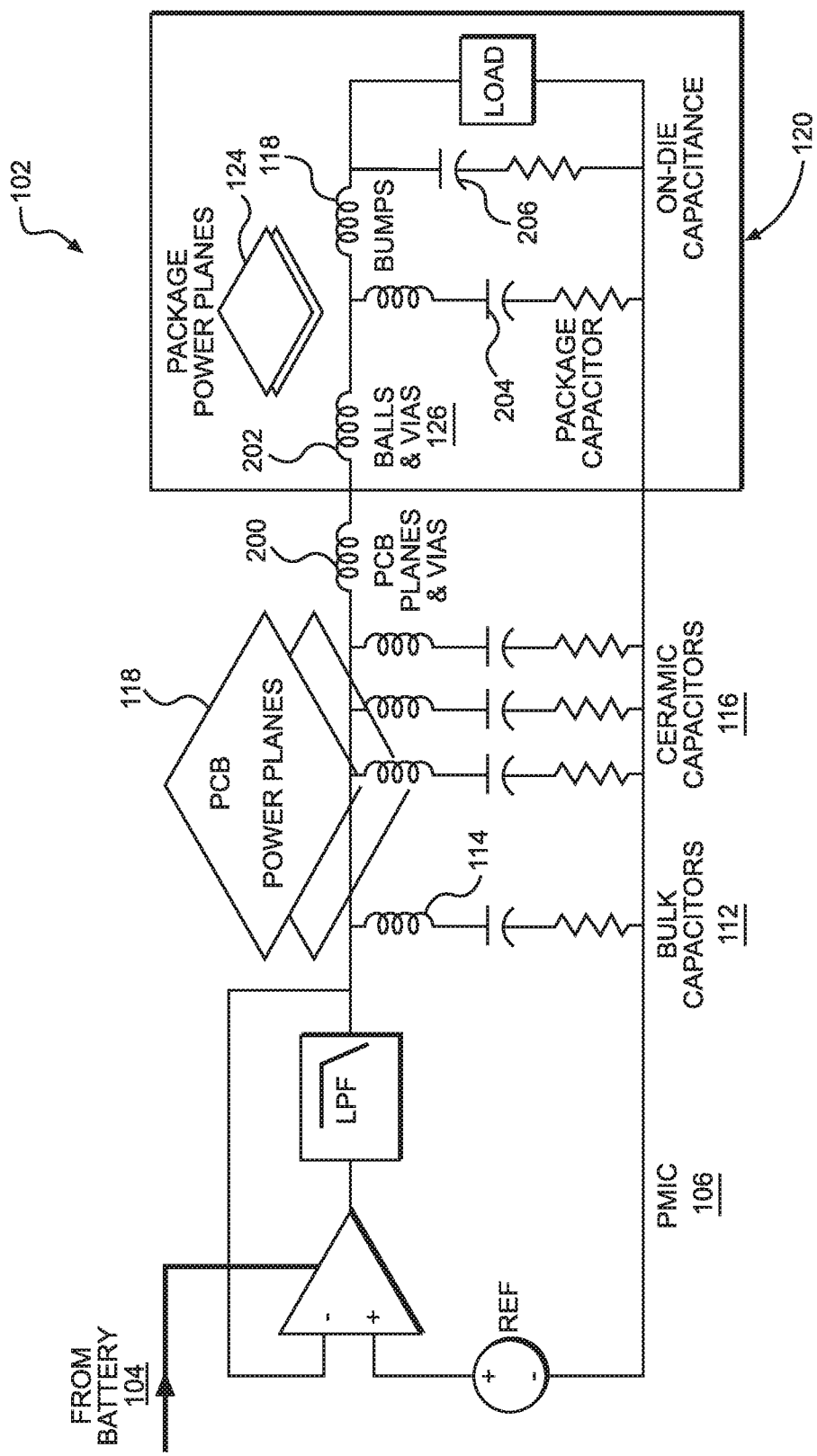
FIG. 2 is a circuit diagram of the elements of FIG. 1.

FIG. 2 provides a circuit diagram of the computing device 102. Additional inductance 200 may be present in PCB planes and vias. Further inductance 202 may be present inside the IC 120 from balls and vias 126. Likewise, there may be a package capacitor 204 as well as on-die capacitance 206. It should be appreciated that the circuit diagram is exemplary and other equivalent circuits may be created. Likewise, the particular placement of elements on the PCB 100 may affect the circuit diagram without departing from the scope of the present disclosure. Rather, the circuit diagram is provided to illustrate exemplary sources of resistance and inductance that contribute to voltage drop between the battery 104 and the IC 120.

Figure 3:
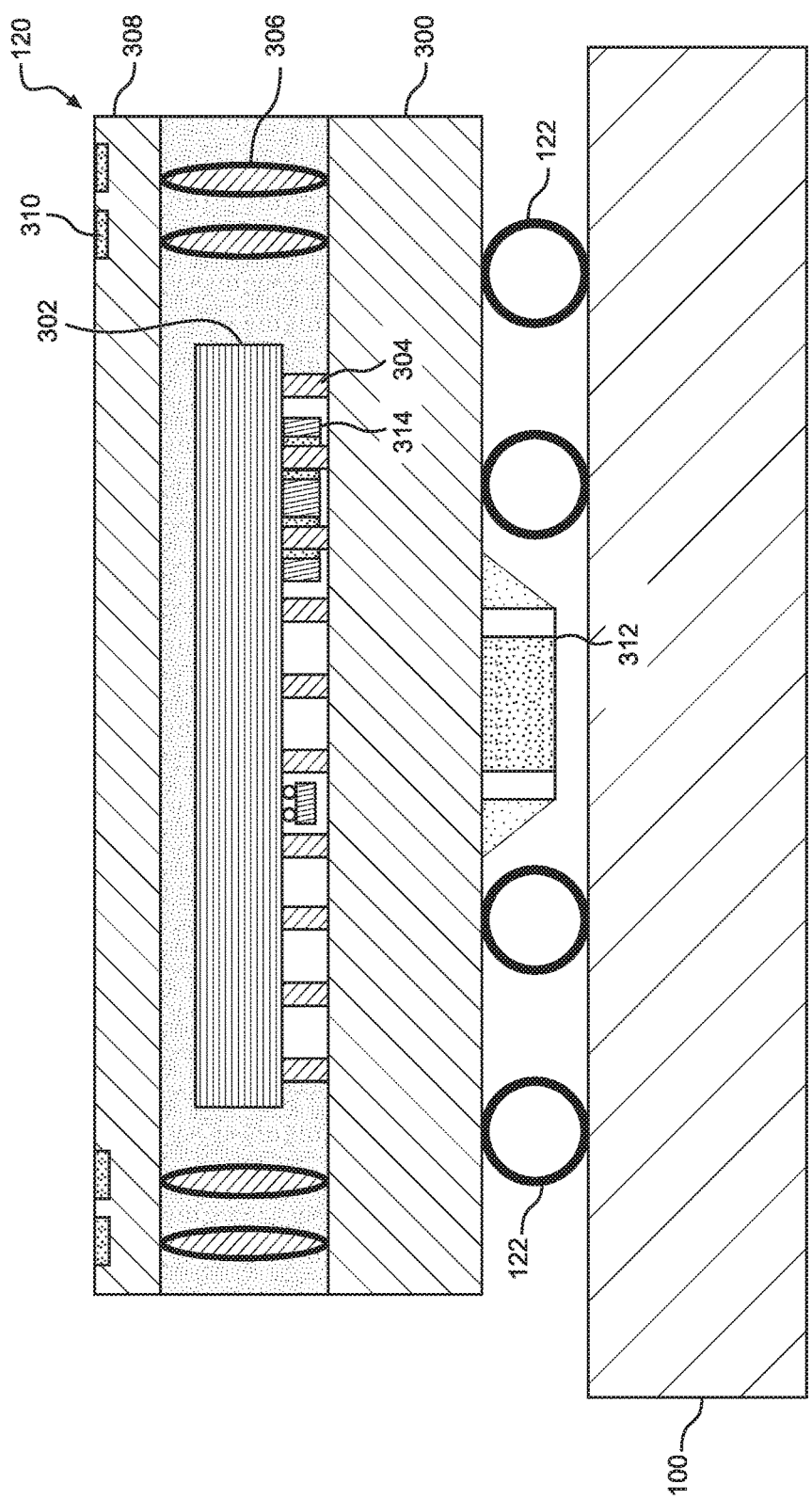
FIG. 3 is a cross-sectional diagram of the IC of FIG. 1 showing two possible locations for bypass capacitors.

FIG. 3 provides more detail about the IC 120. In particular, the IC 120 is coupled to the PCB 100 by solder bumps 122. The solder bumps 122 couple to contacts (not shown) in a substrate 300 of the IC 120. Various metal layers (shown in FIG. 4 below) may be present in the substrate 300. A die 302 may sit atop the substrate 300 and be coupled thereto by interconnects 304. Additional vias 306 may couple the substrate 300 to a cap substrate 308 which may have memory elements 310 therein. Capacitive devices may be added to the assist in reducing voltage drop from ESR and ESL. In particular, a capacitor 312 may be positioned beneath the substrate 300 between the solder bumps 122. Further, an interposer layer capacitor 314 may be positioned between the die 302 and the substrate 300.

Figure 4:
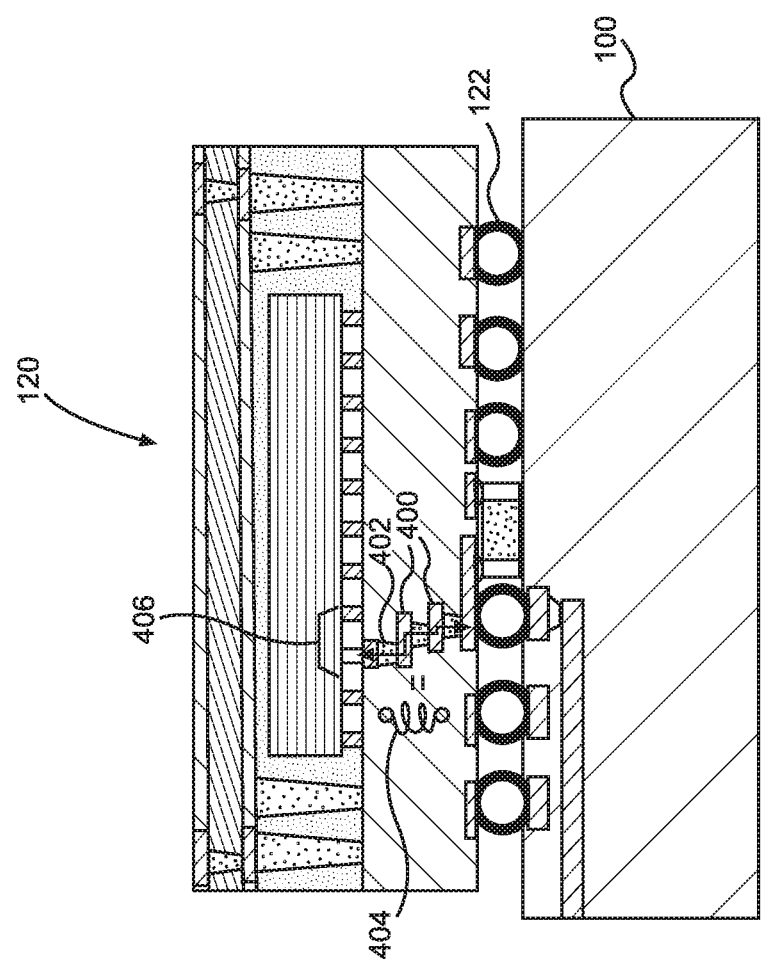
FIG. 4 is a cross-sectional diagram of the IC of FIG. 1 showing an exemplary power path between an external bump and an internal power delivery network with appurtenant inductance created thereby.

FIG. 4 provides an illustration of internal metal layers 400 and vias 402 of the IC 120 along with an equivalent ESL 404. This ESL 404 contributes to a voltage drop between the solder bump 122 and a PDN die area 406, which begins the internal power network within the IC 120.

The IC 120 may require specific voltage levels to operate as designed. The explicit inductive elements as well as ESR and ESL created by the metal traces within the PCB 100, the vias, and the like may cause unwanted voltage drops. Accordingly, a bypass capacitor may be used to help compensate for such voltage drops. As noted, there are traditionally two locations where bypass capacitors can be added. In particular, as illustrated in FIG. 3, a bypass capacitor 312 may be positioned between solder bumps 122, and/or a bypass capacitor 314 may be positioned as an interposer layer in and around the interconnects 304. Past efforts at positioning the bypass capacitor 314 as an interposer layer has met with mixed results.

Figure 5:
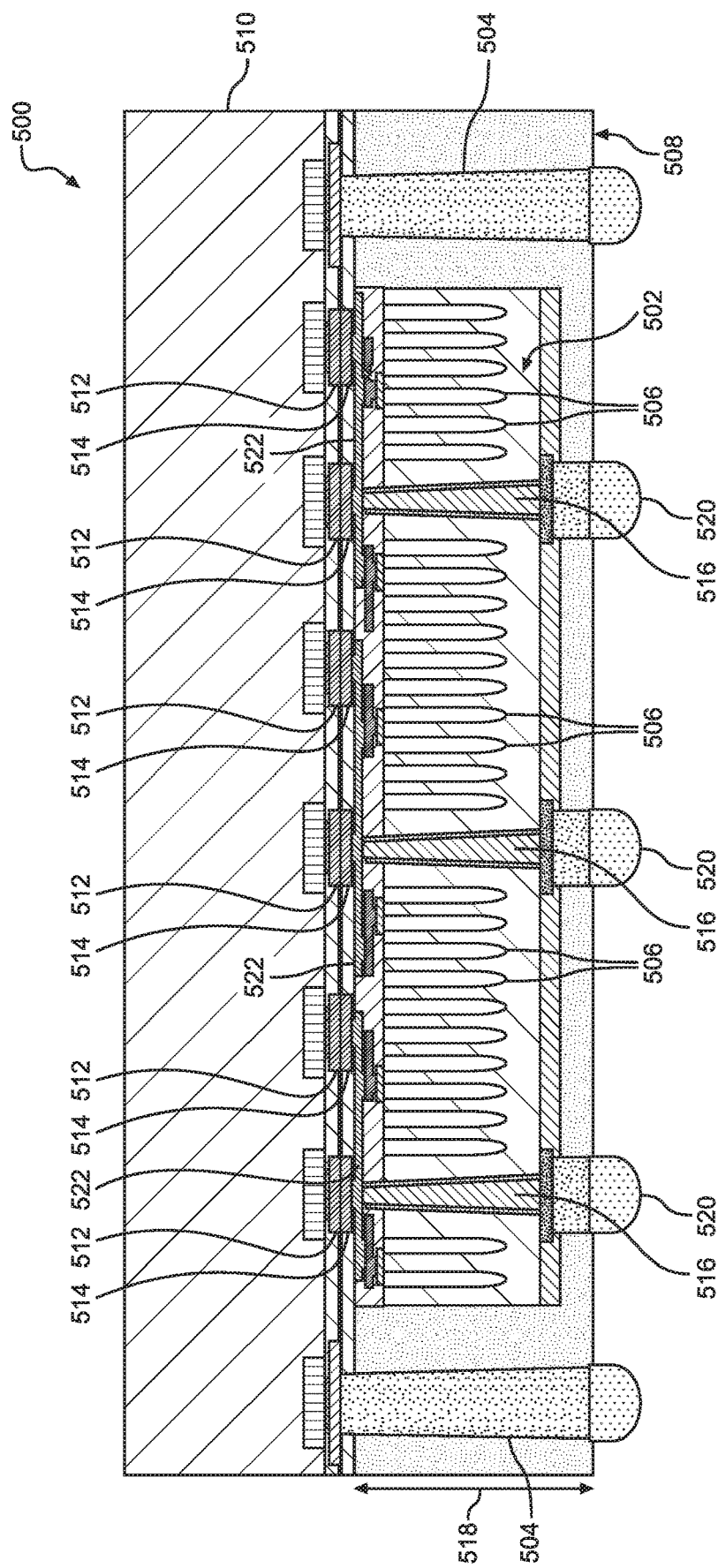
FIG. 5 is a cross-sectional view of an IC having a capacitor interposer layer (CIL) according to an exemplary aspect of the present disclosure.

Exemplary aspects of the present disclosure provide a method for placing a trench bypass capacitor as an interposer layer in such a manner that the ESR and ESL are reduced relative to other designs. In this regard, FIG. 5 provides a cross-sectional profile view of an IC 500 that has a trench bypass capacitor 502 positioned between interconnects 504. More detail about how the trench bypass capacitor 502 is formed may be found below beginning with the discussion of FIG. 10. Returning to FIG. 5, the trench bypass capacitor 502 may be formed from a plurality of trench capacitors 506 (one for each of the trenches). A given trench may be approximately 15-50 micrometers (µm) deep with 30 µm being specifically contemplated. A trench may be approximately one (1) µm in diameter with one (1) µm spacing between trenches. Other dimensions may be used as needed or desired. The trench bypass capacitor 502 is formed as an interposer layer between a wafer 508 and a chip 510. In an exemplary aspect, the chip 510 may be an application processor or mobile device modem (MDM) or the like. The chip 510 is bonded to the wafer 508 using a hybrid copper-to-copper (Cu—Cu) with dielectric-to-dielectric (e.g., oxide-to-oxide, or polymer-to-polymer) bond formed by copper pads 512 and 514, respectively. The Cu—Cu bond reduces resistance at the bond, thereby reducing voltage drop across the bond. Further, the path to the copper pad 514 is relatively straight and provided by a through silicon via (TSV) 516. That is, the TSVs 516 extend straight along an axis 518 from an external bump 520 to a metal layer 522 adjacent to the copper pad 514. In this manner, inductance and resistance going from the external bump 520 to the copper pad 514 is minimized, which helps reduce voltage drop. In an exemplary aspect, the TSVs 516 are copper filled and relatively thin. Whereas traditional TSVs are approximately 60 µm wide, in a further exemplary aspect, the TSVs 516 are approximately 3-10 µm (with approximately 5 µm being specifically considered) wide. The copper filled structure coupled with a smaller keep out zone (KOZ) (e.g., 3-10 µm for a given TSV) of the die-to-chip (DTC) structure allows the CIL to achieve higher effective capacitive density.

Figure 6:
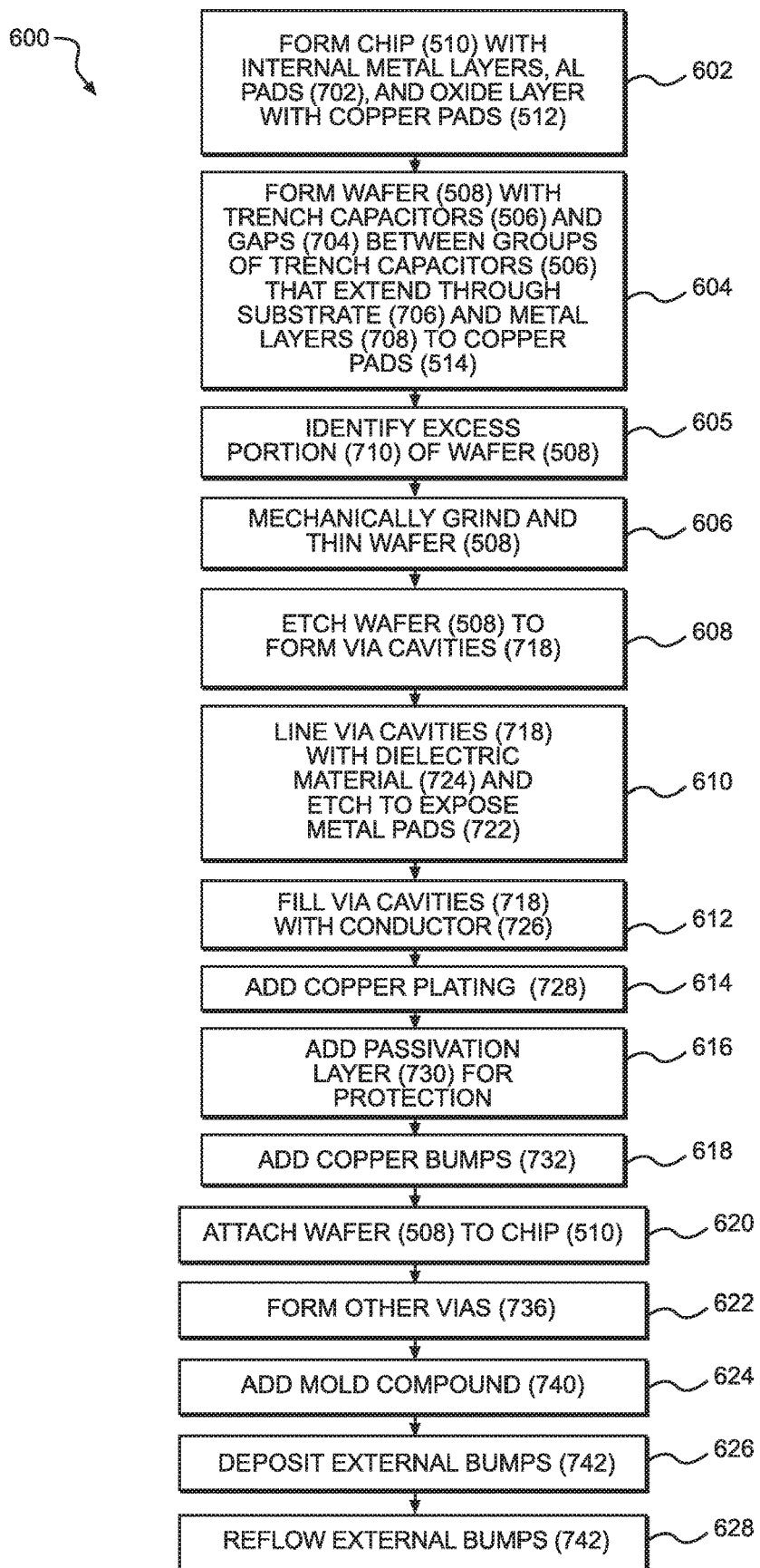
FIG. 6 is a flowchart illustrating an exemplary process for constructing the IC of FIG. 5.
Figure 7D:
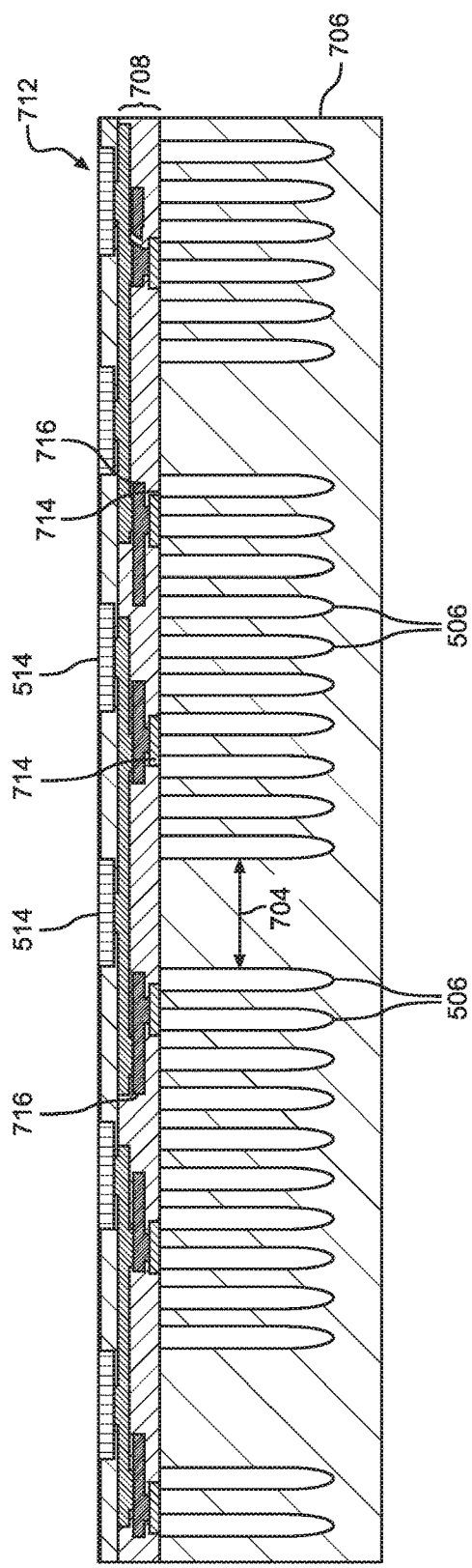
FIGS. 7A-7O illustrate the IC of FIG. 5 as it is being constructed according to the process of FIG. 6.
Figure 7E:
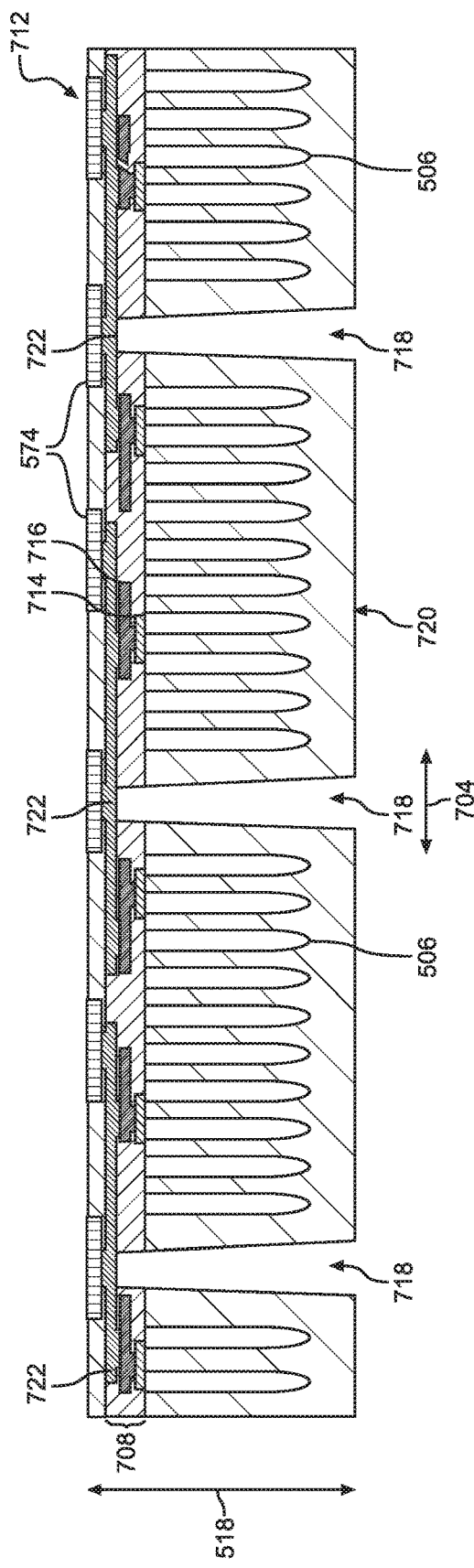
Figure 7J:
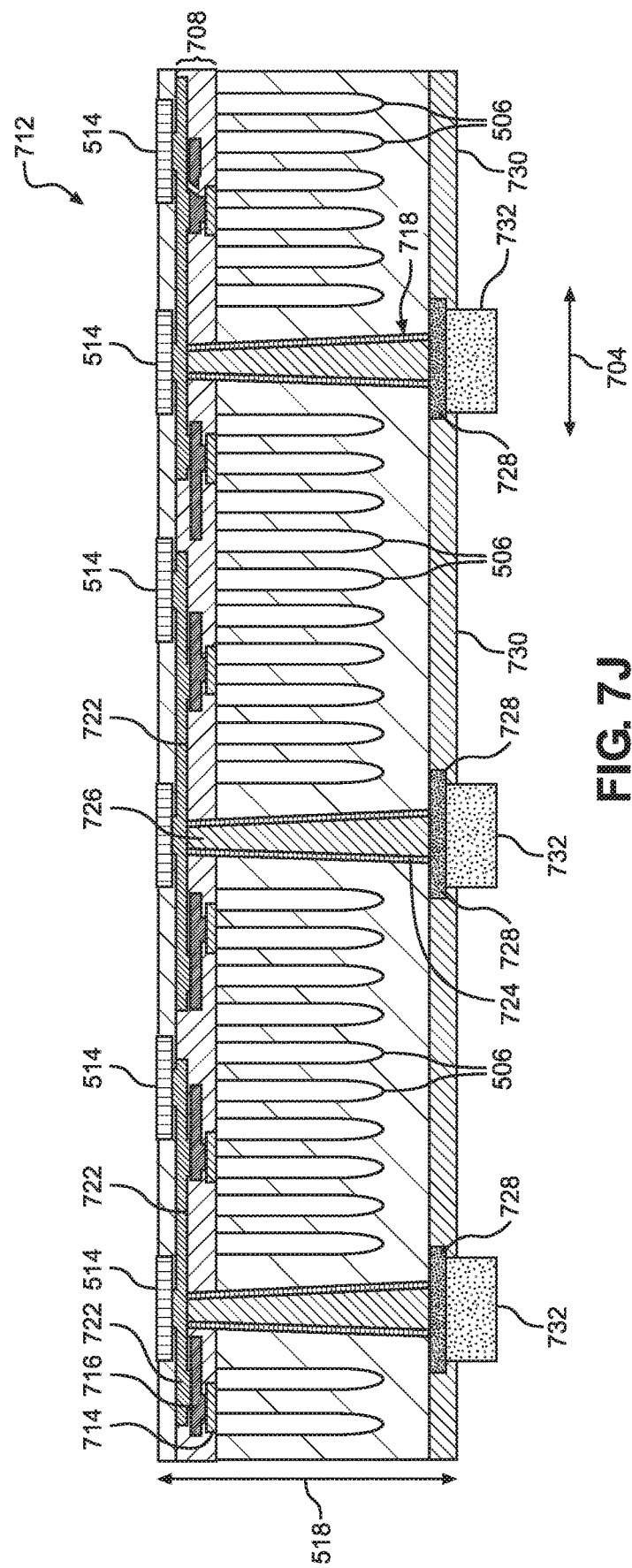
Figure 7K:
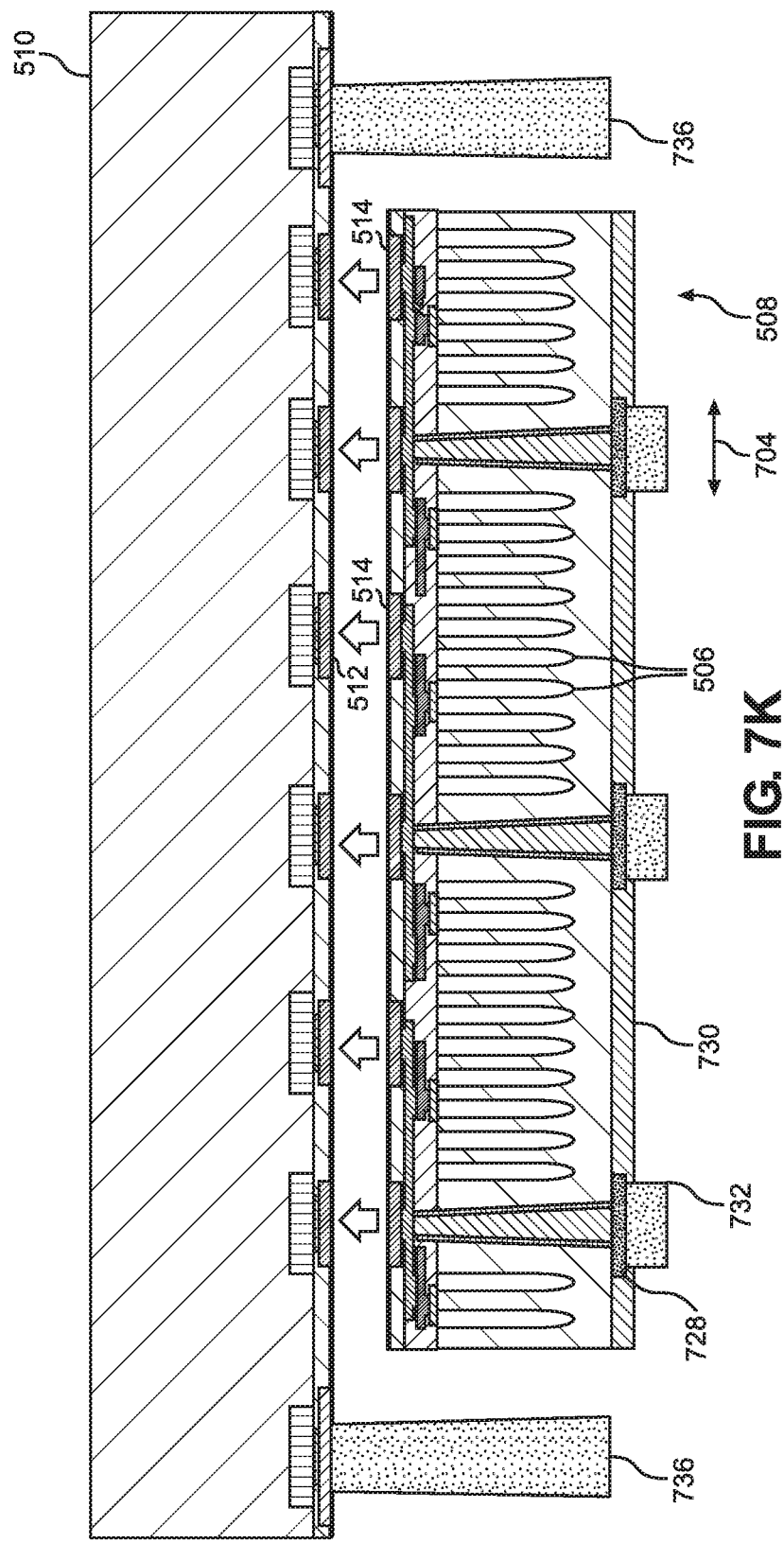
Figure 7L:
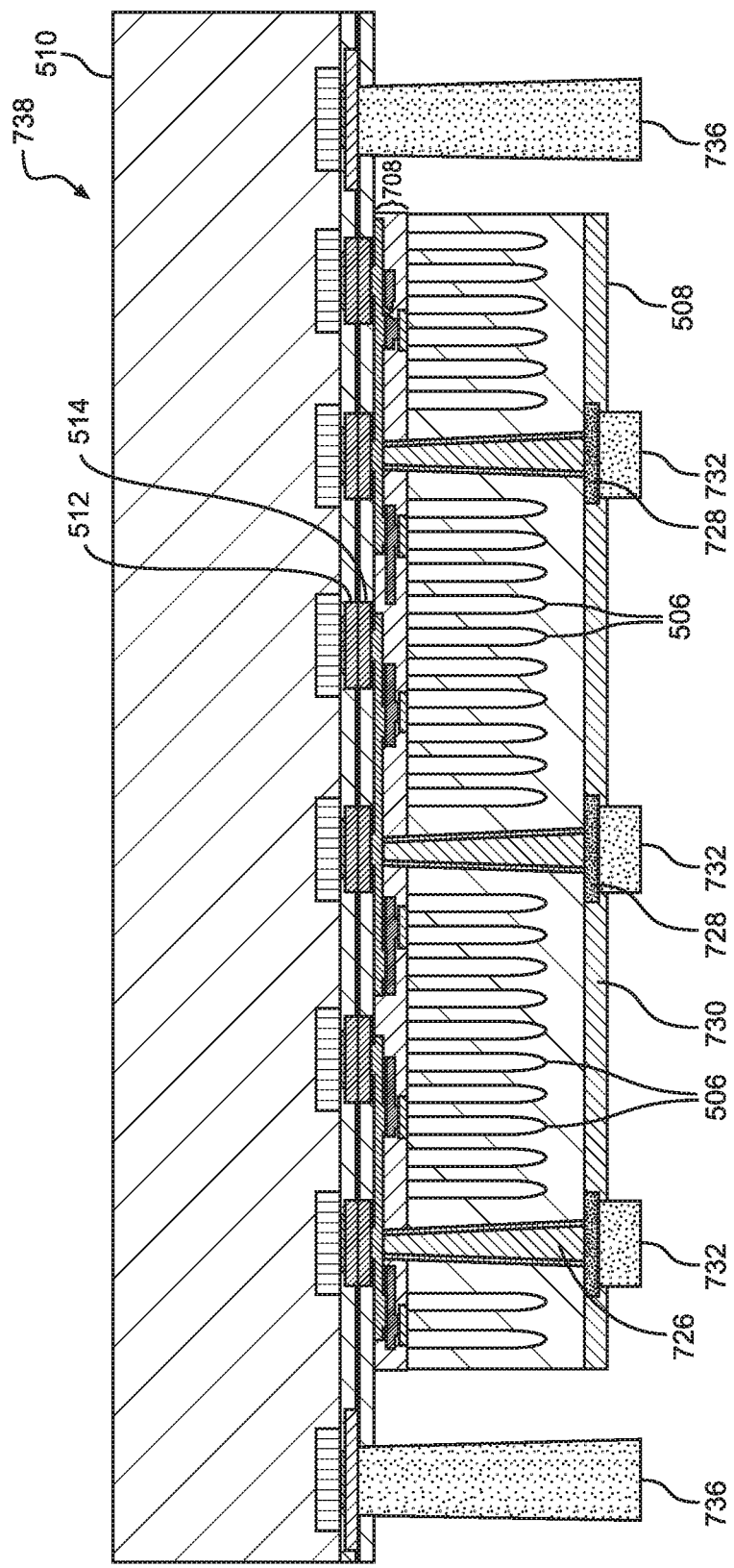
Figure 7M:
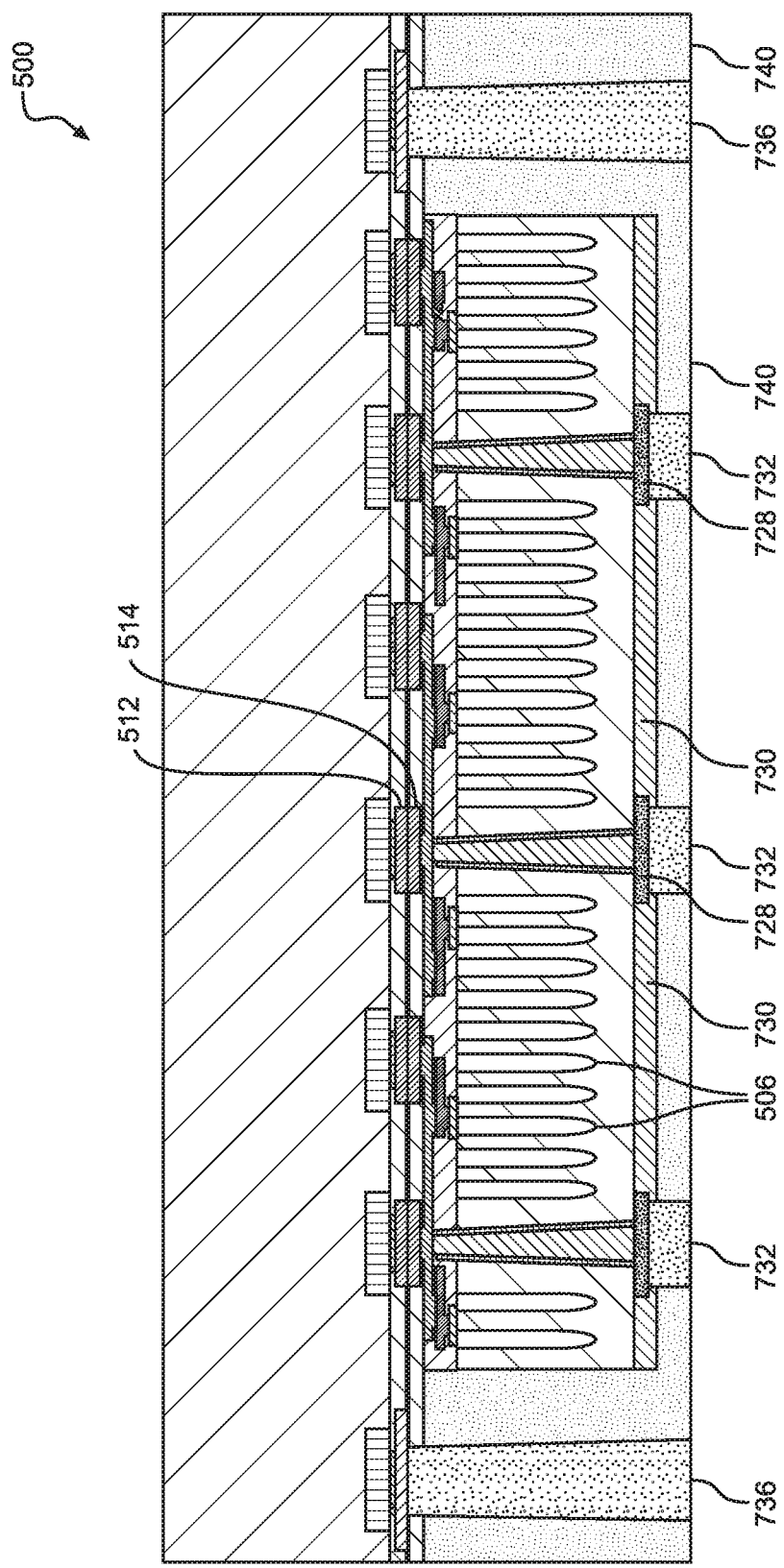
Figure 7N:
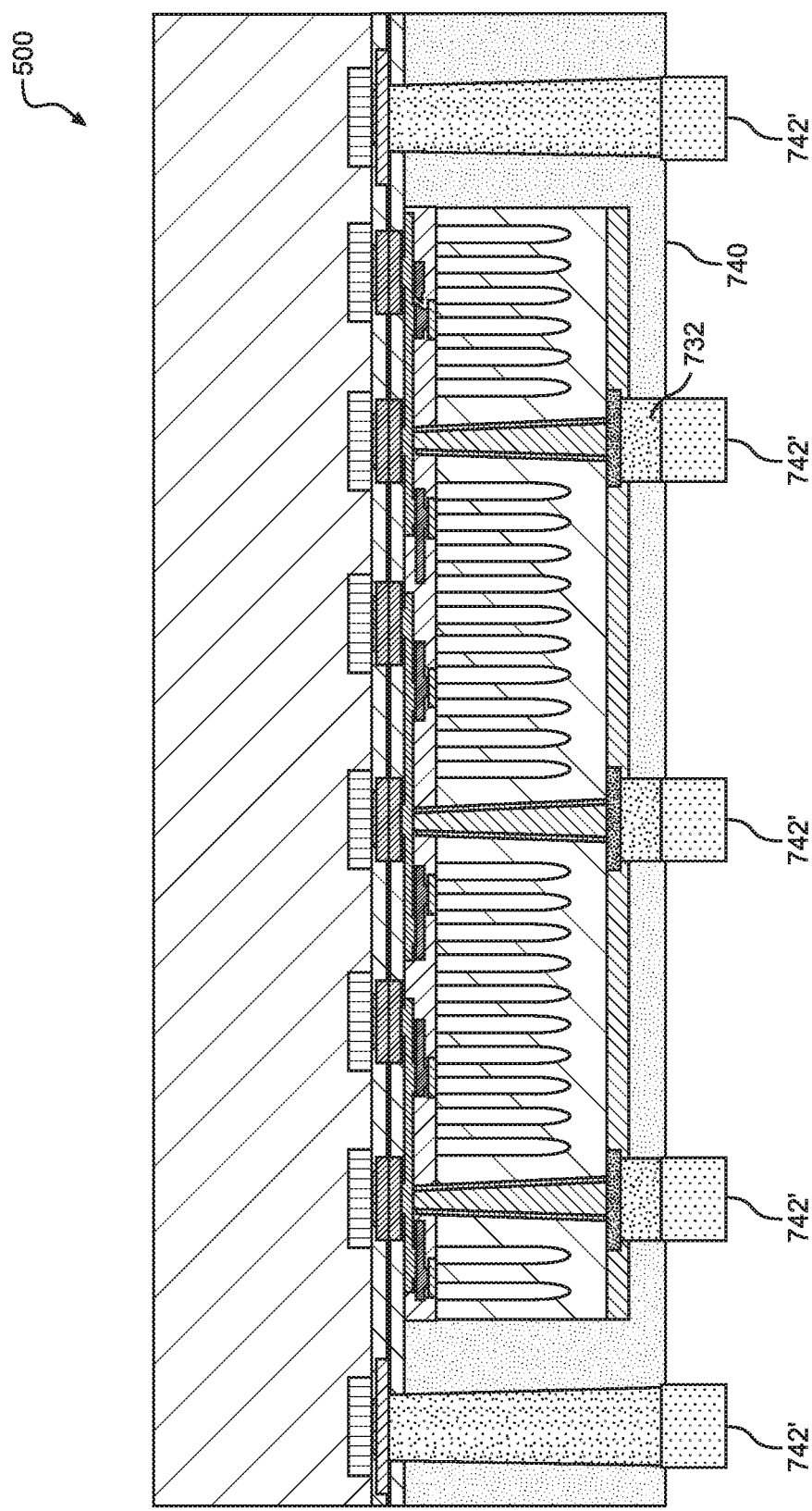
Figure 7O:
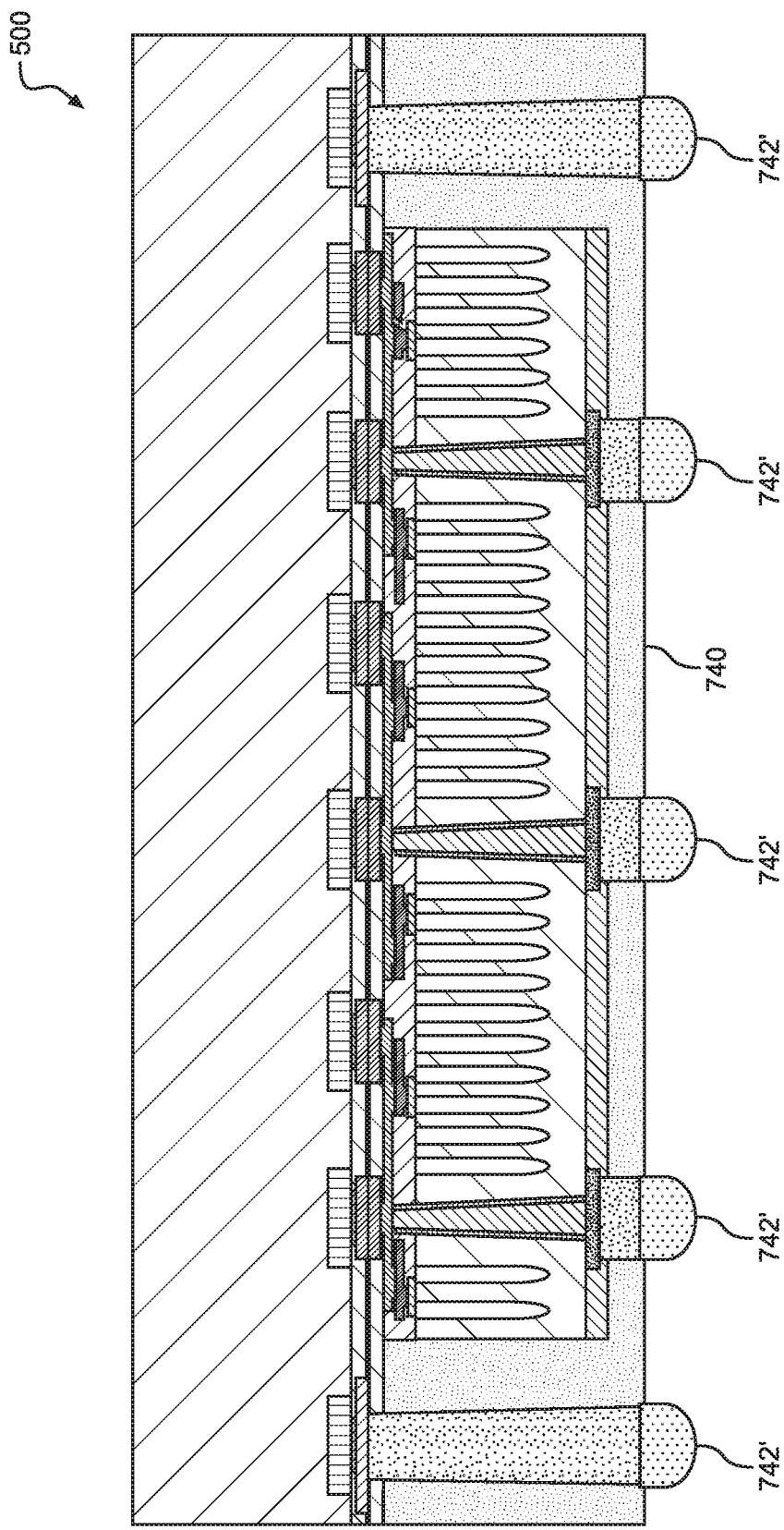

More details about the structure of the IC 500 will become apparent by reference to FIG. 6, which provides a process 600 for forming the IC 500 along with FIGS. 7A-7O, which provide cross-sectional profile views of incremental steps of the process 600. The process 600 begins by forming the chip 510 with internal metal layers (not shown), aluminum (Al) pads 702, and an oxide layer with the copper pads 512 (block 602 and FIG. 7A). Formation of the chip 510 may be at a first foundry and may be made through any conventional processes. Additionally, the process 600 forms the wafer 508 with trench capacitors 506 and gaps 704 between groups of the trench capacitors 506 that extend through a substrate 706. The wafer 508 will ultimately become the CIL of the present disclosure. Additionally, the gaps 704 extend through metal layers 708 to the copper pads 514 (block 604 and FIG. 7A). The wafer 508 may be formed in the same foundry or a different foundry as the chip 510. Additionally, the wafer 508 may be formed before the chip 510 or concurrently therewith. It should be appreciated that the metal layers 708 are separated from one another by intermediate dielectric layers and typically connected to one another by vias as part of a circuit design.

With continued reference to FIG. 6, the process 600 continues by identifying a portion 710 of the wafer 508 that is in excess (block 605 and FIG. 7B). The excess portion 710 is mechanically removed such as by grinding or thinning (block 606) resulting in a thinned wafer structure 712 as shown in FIGS. 7C and 7D. Note that the gaps 704 are maintained through this thinning. FIG. 7D is enlarged to show that the gaps 704 extend through the metal layers 708 including a bottom metal layer 714 through a top metal layer 716. While not shown, there may be intervening metal layers in the metal layers 708. Any such intervening metal layers also do not impinge on the gaps 704.

With continued reference to FIG. 6, the process 600 continues by etching the wafer 508 to form via cavities 718 (block 608 and FIG. 7E), which extend from a lower surface 720 of the wafer 508 to an internal metal pad 722. In an exemplary aspect, the internal metal pad 722 may instead be a metal layer within the metal layers 708 and thus is the actual "top" metal layer instead of top metal layer 716. In an exemplary aspect, the etching may be done with a Borsch deep etch process. As noted, the via cavities 718 extend along the axis 518 that is generally perpendicular to a plane defined by the lower surface 720.

With continued reference to FIG. 6, the process 600 continues by lining the via cavities 718 with a dielectric material 724 (sometimes referred to as a liner) and etching the dielectric material 724 to expose the internal metal pads 722 (block 610 and FIG. 7F). The lined via cavities 718 are then filled with a conductor 726 (block 612 and FIG. 7G). The conductor 726 may be a material such as copper and forms TSVs that extend along the axis 518 from the lower surface 720 to the internal metal pads 722 without contacting the metal of the metal layers 714, 716 at least because of the dielectric material 724 and potentially because the metal of the metal layers 714, 716 is spaced from the cavities 718. These direct, straight TSVs that are not routed through any intervening metal layers 708 such as the top metal layer 716 or the bottom metal layer 714 provide low-resistance connections to prevent excessive voltage drop. The TSVs are also sometimes referred to a means for conducting.

With continued reference to FIG. 6, the process 600 continues by adding copper plating 728 (block 614 and FIG. 7H) to the lower surface 720 to form a copper bump electrically directly coupled to the conductor 726 (e.g., contiguous) within the via cavities 718. A passivation layer 730 is added for protection (block 616 and FIG. 7I) to the lower surface 720 leaving at least a portion of the copper plating 728 exposed.

With continued reference to FIG. 6, the process 600 continues by adding copper bumps 732 (block 618 and FIG. 7J). The wafer 508 is attached to the chip 510 (block 620 and FIG. 7K). Attachment is made through the Cu—Cu bond between the copper pads 512 and 514. After attachment, other vias 736 are formed (block 622) as illustrated in FIG. 7K and composite structure 738 illustrated in FIG. 7L.

With continued reference to FIG. 6, a mold compound 740 is added (block 624 and FIG. 7M) and external bumps 742 are deposited (block 626 and FIG. 7N). The external bumps 742 are then reflowed (block 628 and FIG. 7O) to form rounded bumps 742'. The resulting structure is the IC 500 of FIG. 5. In an exemplary aspect, the copper bumps 732 are optional. When present, the copper bumps 732 may be ground together with the mold compound 740 to have the same level or height.

Figure 8B:
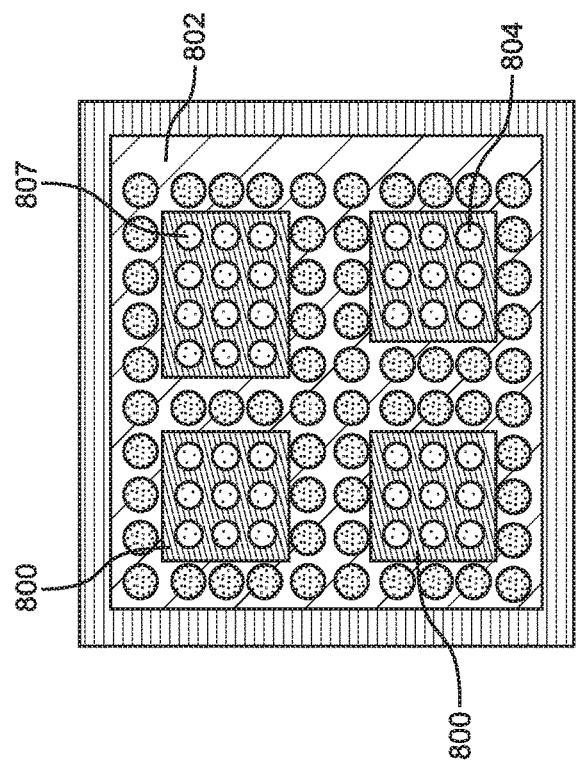
FIGS. 8A and 8B illustrate exemplary possible size and placement variations for the CIL.
Figure 8A:
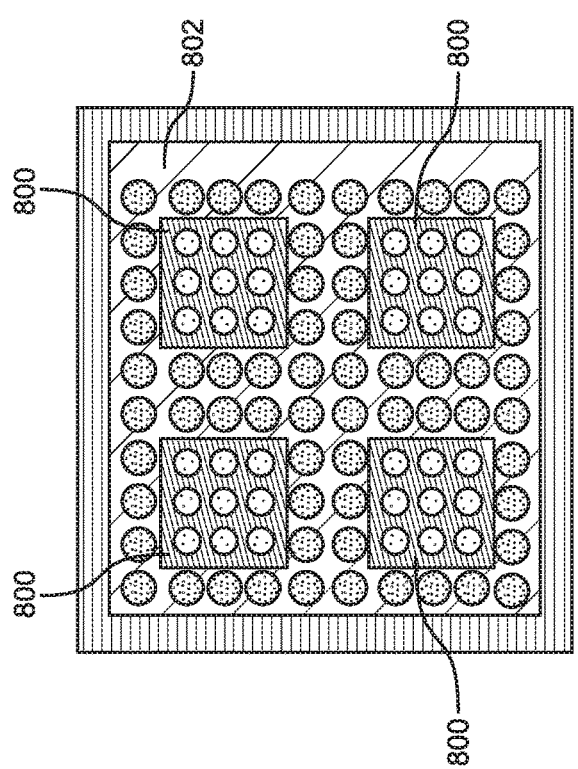

It should be appreciated that the present disclosure provides flexibility in how the wafer 508 is sized. For example, multiple uniformly-sized wafers 800 may be attached to a first chip 802 as illustrated in FIG. 8A. In contrast, differently-sized wafers 804 may be attached to a second chip 806 as illustrated in FIG. 8B.

The CIL in a die-to-wafer 3DIC and methods of forming the same according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 9:
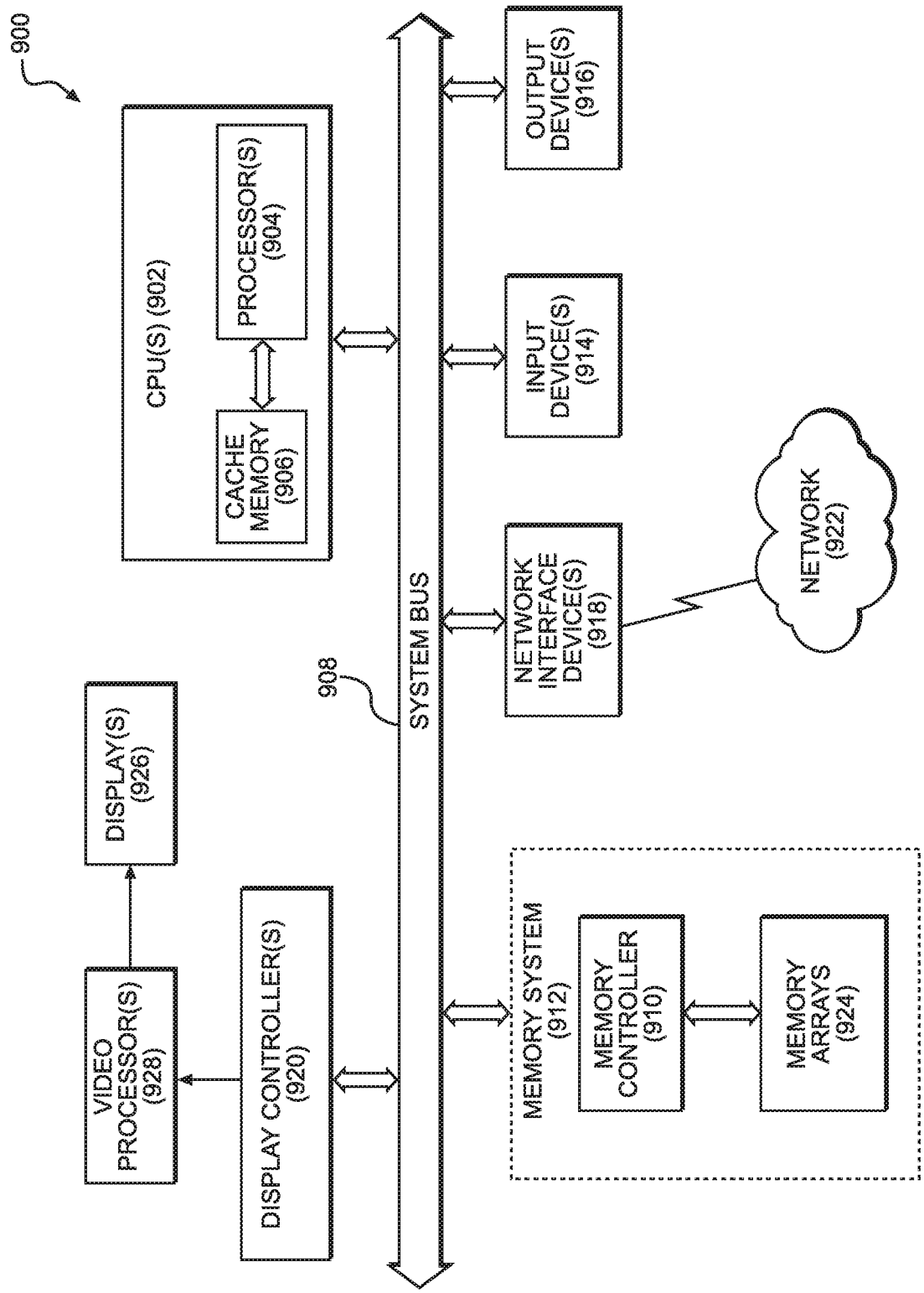
FIG. 9 is a block diagram of an exemplary processor-based system that can include the IC of FIG. 5.

In this regard, FIG. 9 illustrates an example of a processor-based system 900 that can employ the IC 500 illustrated in FIG. 5. In this example, the processor-based system 900 includes one or more central processing units (CPUs) 902, each including one or more processors 904. The CPU(s) 902 may have cache memory 906 coupled to the processor(s) 904 for rapid access to temporarily stored data. The CPU(s) 902 is coupled to a system bus 908 and can intercouple master and slave devices included in the processor-based system 900. As is well known, the CPU(s) 902 communicates with these other devices by exchanging address, control, and data information over the system bus 908. For example, the CPU(s) 900 can communicate bus transaction requests to a memory controller 910.

Other devices can be connected to the system bus 908. As illustrated in FIG. 9, these devices can include a memory system 912, one or more input devices 914, one or more output devices 916, one or more network interface devices 918, and one or more display controllers 920, as examples. The input device(s) 914 can include any type of input device, including, but not limited to, input keys, switches, voice processors, etc. The output device(s) 916 can include any type of output device, including, but not limited to, audio, video, other visual indicators, etc. The network interface device(s) 918 can be any devices configured to allow exchange of data to and from a network 922. The network 922 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 918 can be configured to support any type of communications protocol desired. The memory system 912 can include one or more memory arrays 924.

The CPU(s) 902 may also be configured to access the display controller(s) 920 over the system bus 908 to control information sent to one or more displays 926. The display controller(s) 920 sends information to the display(s) 926 to be displayed via one or more video processors 928, which process the information to be displayed into a format suitable for the display(s) 926. The display(s) 926 can include any type of display, including, but not limited to, a cathode ray tube (CRT), a liquid crystal display (LCD), a plasma display, a light emitting diode (LED) display, etc.

Figure 10:
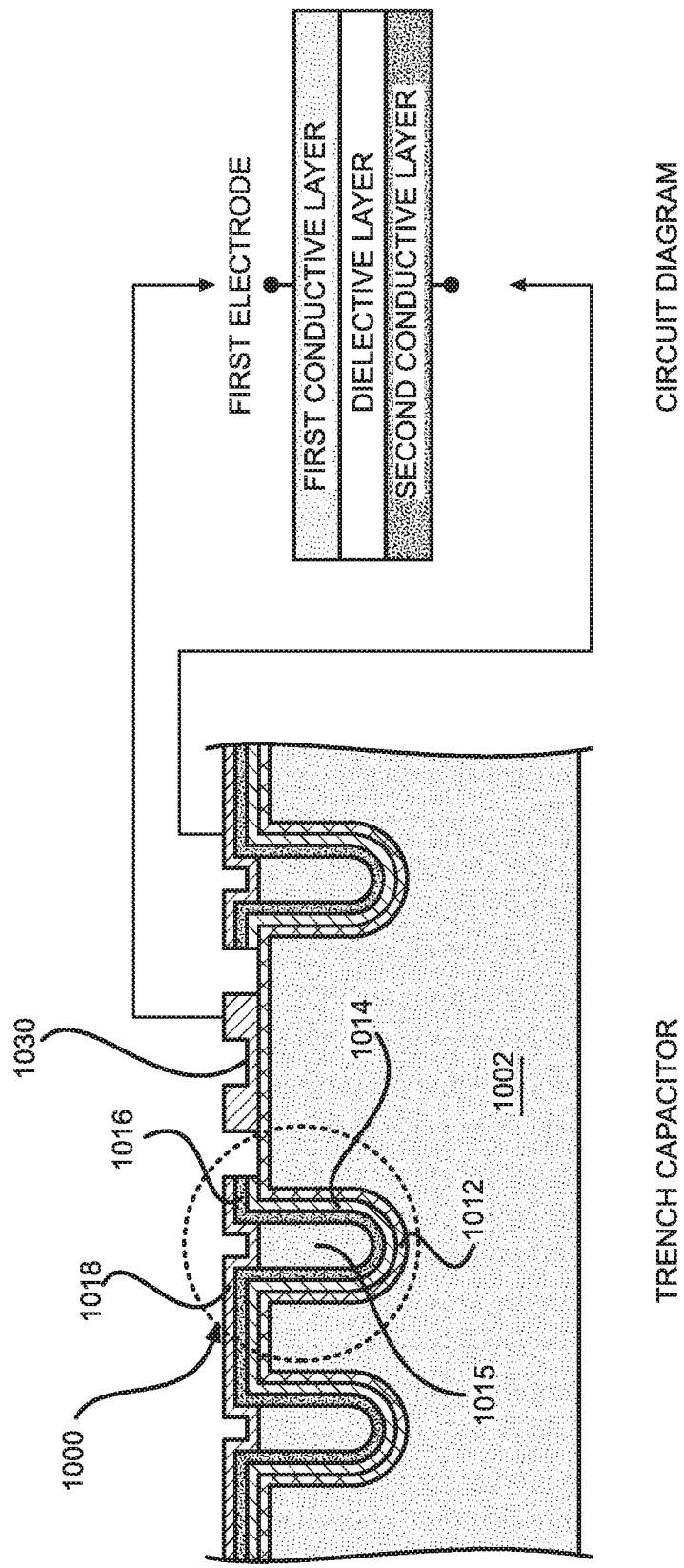
FIG. 10 illustrates a profile view of an exemplary trench capacitor in a substrate.
Figure 11:
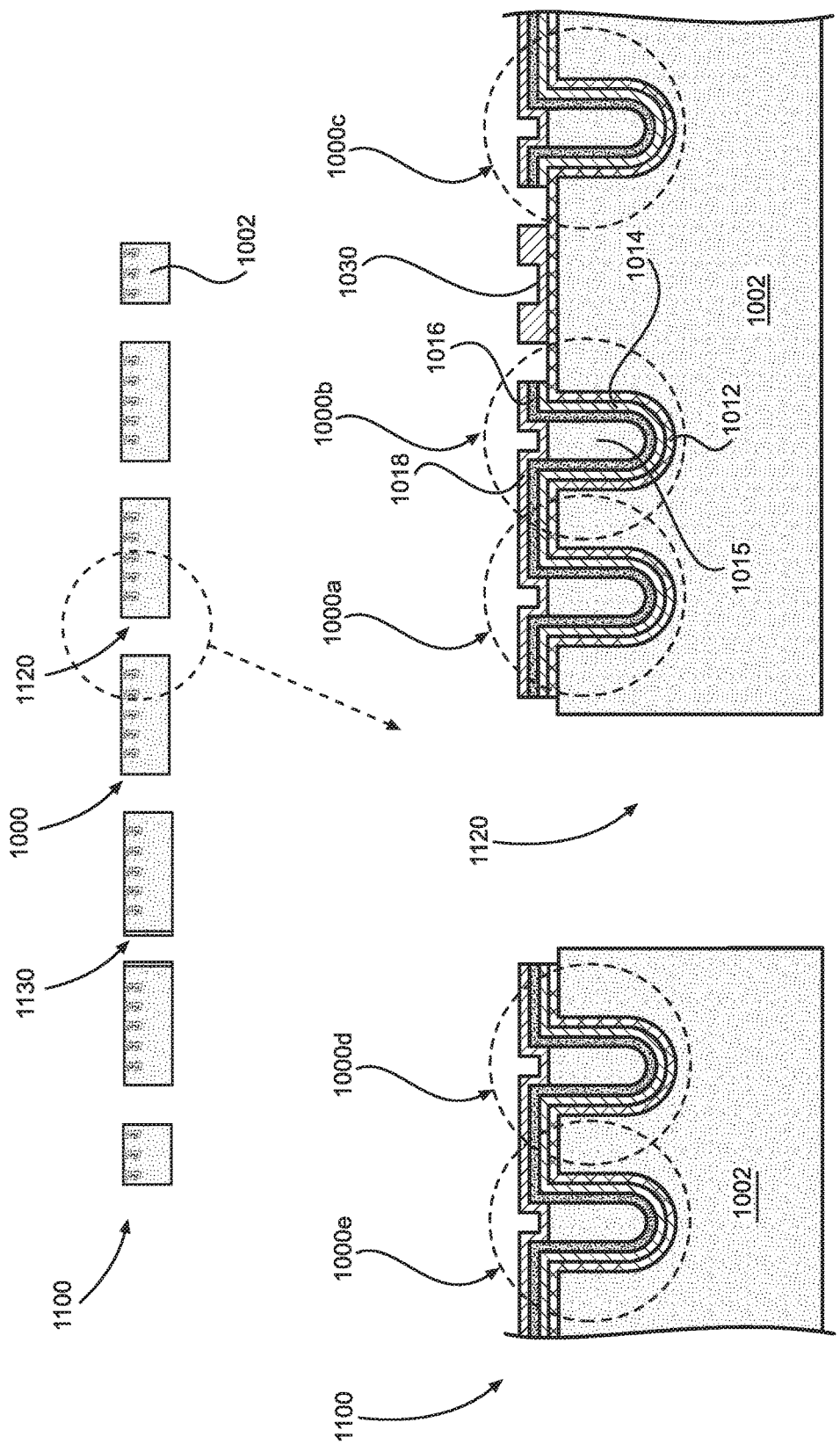
FIG. 11 illustrates a profile view of an exemplary substrate that includes a plurality of trench capacitors.
Figure 12:
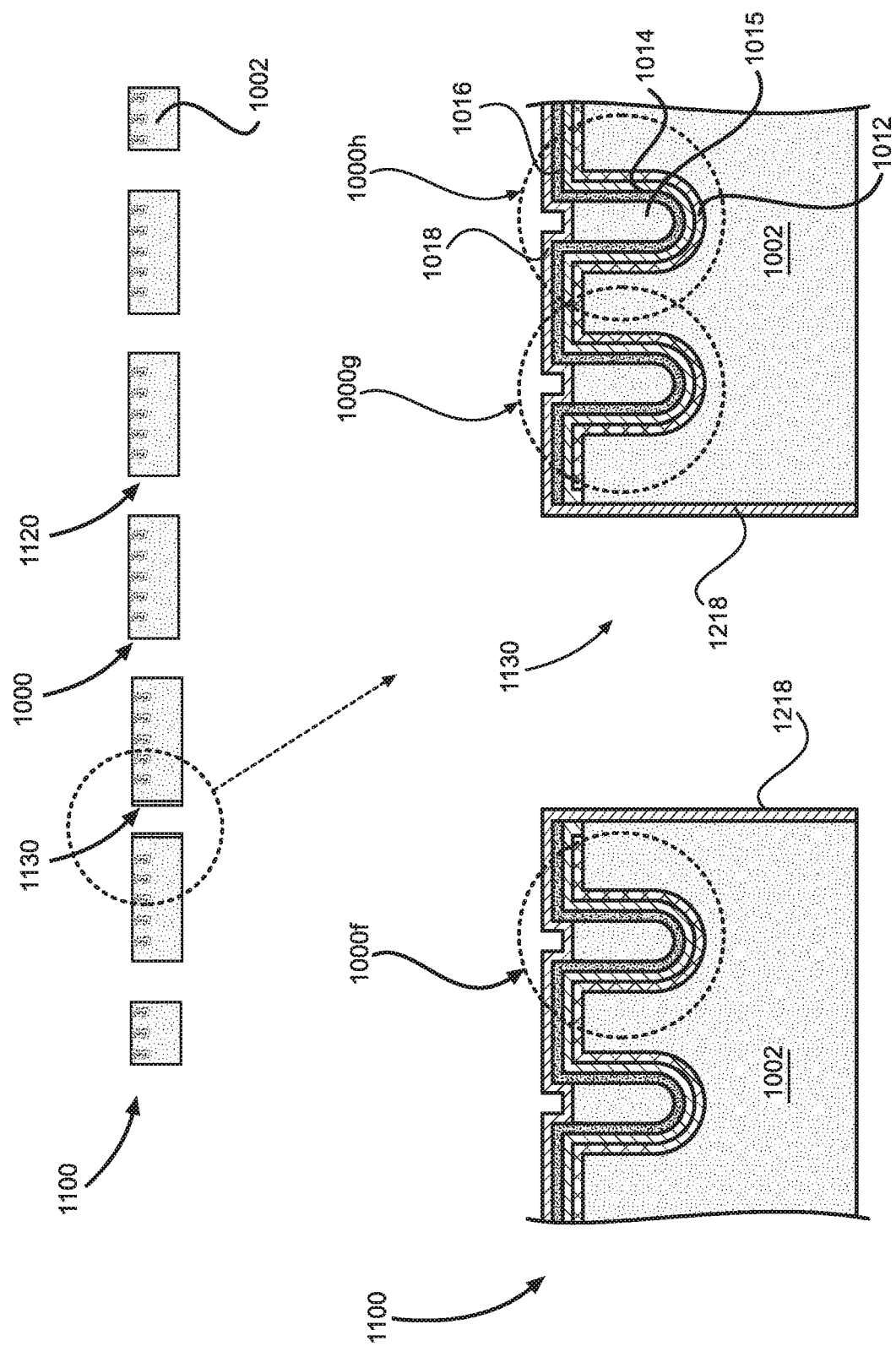
FIG. 12 illustrates a profile view of an exemplary substrate that includes a plurality of trench capacitors.

In the interests of complete disclosure, more details about trench capacitors are provided with reference to FIGS. 10-12. In particular, FIG. 10 illustrates an example of a trench capacitor 1000 that may be implemented in a substrate 1002. FIG. 10 illustrates the substrate 1002, a first electrically conductive layer 1012, a dielectric layer 1014, a second electrically conductive layer 1016, a filler 1015, a second contact layer 1018, and a first contact layer 1030. The trench capacitor 1000 may be a means for trench capacitance. The trench capacitor 1000 may be a type of capacitor.

The first electrically conductive layer 1012, the dielectric layer 1014, the second electrically conductive layer 1016, and the filler 1015 may be located over a first surface of the substrate 1002 and in one or more trenches of the substrate 1002. The first electrically conductive layer 1012 is located (e.g., formed) over the first surface of the substrate 1002 and in one or more trenches of the substrate 1002. The dielectric layer 1014 is located over the first electrically conductive layer 1012. Portions of the dielectric layer 1014 may be located in one or more trenches of the substrate 1002. The second electrically conductive layer 1016 may be located over the dielectric layer 1014. Portions of the second electrically conductive layer 1016 may be located in one or more trenches of the substrate 1002. The second contact layer 1018 may be located over the second electrically conductive layer 1016. The first contact layer 1030 may be located over the first electrically conductive layer 1012.

The trench capacitor 1000 includes the first electrically conductive layer 1012, the dielectric layer 1014 and the second electrically conductive layer 1016. In some implementations, the trench capacitor 1000 may be defined by portions of the first electrically conductive layer 1012, portions of the dielectric layer 1014 and portions of the second electrically conductive layer 1016 that are located in the trench of substrate 1002. It is noted that the trenches of the substrate 1002 may not be visible in FIG. 10 because the trenches of the substrate 1002 may be filled or partially filled with material (e.g., solid material). The shape and/or size of the trenches may vary with different implementations.

The substrate 1002 may include silicon (Si). The first electrically conductive layer 1012 may include N+ silicon. The second electrically conductive layer 1016 may include N+ poly silicon. The first electrically conductive layer 1012 may include N+ poly silicon, and the second electrically conductive layer 1016 may include N+ silicon. It is noted that different implementations may use different materials and/or different combinations of materials for the first electrically conductive layer 1012 and/or the second electrically conductive layer 1016. For example, the first electrically conductive layer 1012 and/or the second electrically conductive layer 1016 may include P+ silicon, P+ poly silicon, copper (Cu), aluminum (Al), and/or other metals. The dielectric layer 1014 may include SiNx, SiO2, Al$_2$O$_3$, HfO$_2$, ZrO$_2$, Ta$_2$O$_5$, and/or combinations thereof. The filler 1015 may include Ajinomoto Buildup Film (ABF), Tungsten (W), or other similar materials. The second contact layer 1018 and/or the first contact layer 1030 may include metal (e.g., Cu, Al).

FIG. 10 also illustrates a circuit diagram that may conceptually represent the trench capacitor 1000. The first electrode of the circuit diagram may be the first contact layer 1030. The second electrode of the circuit diagram may be the second contact layer 1018. As will be further described below, several trench capacitors may be configured to be electrically coupled together to provide an effective capacitor with high capacitance (e.g., high capacitance density).

FIGS. 11 and 12 illustrate a capacitor structure 1100 that includes a capacitor substrate 1002, a plurality of trench capacitors 1000 (e.g., 1000*a*-1000*h*), one or more cavities 1120 and one or more cavities 1130. As will be further described below, the capacitor structure 1100 may be implemented with an integrated device, a substrate, a package and/or a board (e.g., PCB). The capacitor structure 1100 is configured to provide a low-profile capacitor having a high capacitance (e.g., capacitance density), that can be positioned very close to an integrated device to help improve the performance of the integrated device.

As shown in FIG. 11, the capacitor structure 1100 includes the plurality of trench capacitors 1000 (e.g., first trench capacitor, second trench capacitor, third trench capacitor, etc.) that is formed in the substrate 1002 (e.g., in and/or over a first surface of the substrate 1002). One or more of the trench capacitors (e.g., 1000*a*, 1000*b*, 1000*c*, 1000*d*, 1000*e*) may be configured to be electrically coupled together in parallel to collectively provide an effective capacitor having a high capacitance (e.g., capacitance density). In some implementations, the capacitor structure 1100 may be configured as a capacitor having a capacitance density of at least 500 nanofarads per square millimeter (nF/mm$^2$). The substrate 1002 may have a thickness of approximately 100 µm or less. The trench in the substrate 1002, over which the trench capacitor 1000 is formed may have a depth in a range of approximately 5-40 µm.

Each respective trench capacitor (e.g., 1000*a*, 1000*b*, 1000*c*, 1000*d*, 1000*e*) from the plurality of the trench capacitors 1000 may be defined by respective portions of the first electrically conductive layer 1012, respective portions of the dielectric layer 1014, and respective portions of the second electrically conductive layer 1016 that are located in a respective trench of the substrate 1002. Thus, for example a first trench capacitor 1000*a* may be defined in a first trench of the substrate 1002, and a second trench capacitor 1000*b* may be defined in a second trench of the substrate 1002. The first trench capacitor 1000*a* may be configured to be electrically coupled in parallel to the second trench capacitor 1000*b*. It is noted that any trench capacitor from the plurality of trench capacitors 1000 may be the first or second trench capacitors. As such, the use of the terms first trench capacitor and second trench capacitor are not limited to any particular trench capacitor in the disclosure. As mentioned above, a trench capacitor may be a type of capacitor. Thus, for example, the first trench capacitor may be a first capacitor, and the second trench capacitor may be a second capacitor.

FIG. 11 illustrates a cavity 1120 that travels through the substrate 1002. The cavity 1120 is configured to allow an interconnect to travel through the substrate 1002. In some implementations, the interconnect that travels through the cavity 1120 of the substrate 1002 may be coupled to an integrated device and a substrate. In some implementations, the interconnect that travels through the cavity 1120 of the substrate 1002 may be coupled to a substrate and a board (e.g., PCB). The interconnect that travels through the cavity 1120 may include one or more interconnects. The interconnect that travels through the cavity 1120 may include a pillar, a via and/or a solder interconnect. The interconnect that travels through the cavity 1120 may not be in direct contact with (e.g., not directly touching) the first electrically conductive layer 1012, the second electrically conductive layer 1016, the first contact layer 1030, and/or the second contact layer 1018.

FIG. 12 illustrates a close-up view of another portion of the capacitor structure 1100. As shown in FIG. 12, the capacitor structure 1100 includes the capacitor substrate 1002, the cavity 1130, a trench capacitor 1000*f*, a trench capacitor 1000*g* and a trench capacitor 1000*h*. Two or more of the trench capacitors 1000 may be configured to be electrically coupled together in parallel.

As shown in FIG. 12, the cavity 1130 travels through the substrate 1002. A wall of the cavity 1130 may be covered with a contact layer 1218. The contact layer 1218 may include a metal layer (e.g., Cu). The contact layer 1218 may be coupled to the second contact layer 1018. The cavity 1130 is configured to allow an interconnect to travel through the substrate 1002. The interconnect that travels through the cavity 1130 may be coupled to the contact layer 1218. In some implementations, the contact layer 1218 may be considered part of the second contact layer 1018.

In some implementations, the interconnect that travels through the cavity 1130 of the substrate 1002 may be coupled to an integrated device and a substrate. In some implementations, the interconnect that travels through the cavity 1130 of the substrate 1002 may be coupled to a substrate and a board (e.g., PCB). The interconnect that travels through the cavity 1130 may include one or more interconnects. The interconnect that travels through the cavity 1130 may include a pillar, a via, and/or a solder interconnect.

Different implementations may include different configurations, arrangements and/or placements of the trench capacitors 1000. For example, the capacitor structure 1101 may include a different number of trench capacitors 1000.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC) comprising:
   a chip comprising a first copper pad; and
   a capacitor interposer layer (CIL) comprising:
      at least two trench capacitors, each trench capacitor comprising a plurality of trenches, the at least two trench capacitors defining a gap therebetween;
      a second copper pad coupled to the first copper pad, the second copper pad positioned between the at least two trench capacitors;
      a metal pad conductively coupled to the second copper pad; and
      a via extending from a lower surface of the gap to the metal pad.

2. The IC of claim 1, wherein the chip comprises an application processor.

3. The IC of claim 1, wherein the chip comprises a mobile device modem.

4. The IC of claim 1, further comprising an external bump conductively coupled to the via.

5. The IC of claim 1, wherein the via extends through at least one intervening metal layer without contacting metal therein.

6. The IC of claim 1, further comprising a liner surrounding the via, wherein the liner comprises a dielectric material.

7. The IC of claim 4, further comprising a copper bump positioned between the external bump and the via.

8. The IC of claim 1, further comprising a mold compound surrounding the CIL.

9. The IC of claim 1, further comprising an additional via positioned outside the CL and coupling another external bump to the chip.

10. The IC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. A method of forming an integrated circuit (IC), comprising:
   forming gaps between trench capacitors in a capacitor interposer layer (CIL);
   etching the CIL at the gaps to form a via cavity;
   forming a via in the via cavity; and
   attaching the CIL to a chip using a copper-to-copper bond between two copper pads.

12. The method of claim 11, further comprising lining the via cavity with a dielectric material.

13. The method of claim 11, wherein the chip comprises an application processor.

14. The method of claim 11, wherein the chip comprises a mobile device modem.

15. The method of claim 11, further comprising thinning the CIL.

16. The method of claim 11, wherein forming the via comprises filling the via cavity with a conductor.

17. The method of claim 11, further comprising adding copper plating at one end of the via.

18. The method of claim 17, further comprising adding a passivation layer adjacent to the copper plating.

19. The method of claim 11, further comprising forming other vias outside the CIL and coupling the chip to external bumps.

20. The method of claim 11, further comprising adding a mold compound around the CIL.

* * * * *